(12) United States Patent
Dansberg et al.

(10) Patent No.: US 10,087,019 B2
(45) Date of Patent: Oct. 2, 2018

(54) LOAD LOCK SYSTEM AND METHOD FOR TRANSFERRING SUBSTRATES IN A LITHOGRAPHY SYSTEM

(71) Applicant: Mapper Lithography IP B.V., Delft (NL)

(72) Inventors: Michel Pieter Dansberg, Delft (NL); Sjoerd Hesdahl, Delft (NL); Jan Pieter Roelof Jongeneel, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 119 days.

(21) Appl. No.: 14/939,910

(22) Filed: Nov. 12, 2015

(65) Prior Publication Data

US 2016/0137427 A1 May 19, 2016

Related U.S. Application Data

(60) Provisional application No. 62/079,598, filed on Nov. 14, 2014.

(51) Int. Cl.
*H01L 21/677* (2006.01)
*B25J 9/04* (2006.01)
(Continued)

(52) U.S. Cl.
CPC ............ *B65G 47/90* (2013.01); *B25J 9/0087* (2013.01); *B25J 9/043* (2013.01); *G03F 7/7075* (2013.01);
(Continued)

(58) Field of Classification Search
CPC .......... B25J 9/0087; B25J 9/043; B25J 9/044; B65G 47/902; H01L 21/67742;
(Continued)

(56) References Cited

U.S. PATENT DOCUMENTS 4,483,654 A * 11/1984 Koch ................ H01L 21/67748
414/744.5
4,589,818 A * 5/1986 Brown ................ B65G 47/902
414/744.3
(Continued)

FOREIGN PATENT DOCUMENTS

CN 1554112 A 12/2004
CN 101128915 A 2/2008
(Continued)

OTHER PUBLICATIONS

Search Report and Written Opinion in Netherlands Application No. NL2015784 dated Sep. 21, 2016.
(Continued)

*Primary Examiner* — James W Keenan
(74) *Attorney, Agent, or Firm* — Womble Bond Dickinson (US) LLP

(57) ABSTRACT

The present invention relates to an apparatus and a method for transferring substrates into and from a vacuum chamber in a lithography apparatus. The load lock system comprises: a load lock chamber provided with an opening for allowing passage of a substrate in and out of the load lock chamber, and a transfer apparatus comprising a sub-frame at least partially arranged in the load lock chamber, an arm which is, with a proximal end thereof, connected to the sub-frame, and a substrate receiving unit which is connected to a distal end of the arm. The arm comprises at least three hinging arm parts, wherein a first and a second arm part are hingedly connected to the sub-frame with a proximal end thereof. A third arm part is hingedly connected to the distal ends of the first and second arm parts. The arm parts are arranged to form a four-bar linkage.

47 Claims, 8 Drawing Sheets

(51) Int. Cl.
  *B65G 47/90* (2006.01)
  *B25J 9/00* (2006.01)
  *G03F 7/20* (2006.01)
  *H01L 21/67* (2006.01)
  *H01L 21/687* (2006.01)

(52) U.S. Cl.
  CPC .. *H01L 21/67201* (2013.01); *H01L 21/67225* (2013.01); *H01L 21/67742* (2013.01); *H01L 21/67766* (2013.01); *H01L 21/68707* (2013.01)

(58) Field of Classification Search
  CPC ......... H01L 21/67745; H01L 21/67748; H01L 21/67751
  See application file for complete search history.

(56) References Cited

U.S. PATENT DOCUMENTS

| | | | |
|---|---|---|---|
| 4,951,601 A * | 8/1990 | Maydan | H01L 21/67167 118/715 |
| 5,743,704 A | 4/1998 | Caveney et al. | |
| 5,885,052 A | 3/1999 | Tsuji et al. | |
| 5,963,753 A | 10/1999 | Ohtani et al. | |
| 6,109,860 A | 8/2000 | Ogawa et al. | |
| 6,166,509 A | 12/2000 | Wyka et al. | |
| 6,573,520 B1 | 6/2003 | Satoh et al. | |
| 6,663,333 B2 * | 12/2003 | Kinnard | B25J 9/0093 414/217 |
| 6,897,458 B2 | 5/2005 | Wieland et al. | |
| 6,958,804 B2 | 10/2005 | Wieland et al. | |
| 7,019,908 B2 | 3/2006 | van 't Spijker et al. | |
| 7,084,414 B2 | 8/2006 | Wieland et al. | |
| 7,129,502 B2 | 10/2006 | Kruit | |
| 7,246,985 B2 * | 7/2007 | Ferrara | H01L 21/67201 414/217 |
| 7,758,295 B2 * | 7/2010 | Liu | B25B 5/10 414/744.3 |
| 8,436,324 B2 | 5/2013 | De Jong | |
| 8,992,160 B2 * | 3/2015 | Furuichi | H01L 21/67742 414/222.07 |
| 9,076,830 B2 * | 7/2015 | Kremerman | H01L 21/67742 |
| 9,149,936 B2 * | 10/2015 | Hosek | B25J 9/042 |
| 9,202,733 B2 * | 12/2015 | Hosek | H01L 21/677 |
| 9,579,804 B2 * | 2/2017 | Kato | B25J 9/044 |
| 2002/0048506 A1 | 4/2002 | Babbs et al. | |
| 2003/0012624 A1 | 1/2003 | Kinnard et al. | |
| 2004/0179930 A1 | 9/2004 | Kondoh | |
| 2004/0221811 A1 * | 11/2004 | Mitchell | H01L 21/67126 118/719 |
| 2005/0072358 A1 | 4/2005 | Katsuoka et al. | |
| 2006/0188358 A1 | 8/2006 | Bonora et al. | |
| 2007/0064213 A1 | 3/2007 | Jager et al. | |
| 2009/0212229 A1 | 8/2009 | Wieland et al. | |
| 2009/0259337 A1 | 10/2009 | Harrold et al. | |
| 2009/0261267 A1 | 10/2009 | Wieland et al. | |
| 2010/0129182 A1 | 5/2010 | Ishida | |
| 2010/0240200 A1 | 9/2010 | Sakaue et al. | |
| 2010/0265486 A1 | 10/2010 | De Jong et al. | |
| 2011/0073782 A1 | 3/2011 | Wieland | |
| 2011/0079730 A1 | 4/2011 | Wieland | |
| 2011/0216299 A1 | 9/2011 | Steenbrink et al. | |
| 2012/0175527 A1 | 7/2012 | De et al. | |
| 2013/0336753 A1 | 12/2013 | Shimamoto | |
| 2014/0202921 A1 | 7/2014 | Babbs et al. | |
| 2014/0262979 A1 | 9/2014 | Bonora et al. | |
| 2014/0271055 A1 | 9/2014 | Weaver et al. | |
| 2017/0361459 A1 * | 12/2017 | Caveney | B25J 9/126 |

FOREIGN PATENT DOCUMENTS

| | | |
|---|---|---|
| CN | 103370655 A | 10/2013 |
| EP | 1394840 A2 | 3/2004 |
| EP | 1457829 | 9/2004 |
| EP | 2099061 | 9/2009 |
| JP | 64-64232 | 3/1989 |
| JP | H01120336 U | 8/1989 |
| JP | H9-323276 A | 12/1997 |
| JP | H11121362 | 4/1999 |
| JP | 2000-40730 | 2/2000 |
| JP | 2003068600 | 3/2003 |
| JP | 2005-116665 | 4/2005 |
| JP | 2005136247 | 5/2005 |
| JP | 2005-175413 | 6/2005 |
| JP | 3975164 | 9/2007 |
| JP | 2009205127 | 9/2009 |
| JP | 4425801 | 3/2010 |
| JP | 2011-119327 | 6/2011 |
| JP | 2012-156308 | 8/2012 |
| JP | 2013-175737 | 9/2013 |
| KR | 20100015494 | 2/2010 |
| KR | 20100135293 | 12/2010 |
| WO | WO-03008157 | 1/2003 |
| WO | WO-2008023560 A1 * | 2/2008 ............ B25J 9/0084 |
| WO | WO-2008129776 | 10/2008 |
| WO | WO-2008144668 | 11/2008 |
| WO | WO-2009037675 | 3/2009 |
| WO | WO-2009127658 | 10/2009 |
| WO | WO-2010094802 | 8/2010 |
| WO | WO-2012146789 | 11/2012 |
| WO | WO-2016076722 A2 | 5/2016 |

OTHER PUBLICATIONS

Office Action in Japanese Patent Application No. 2016-549048 dated Jul. 14, 2017, with English translation.
International Search Report, dated Jun. 3, 2016, Application No. PCT/NL2015/050796.
Office Action received for Chinese Patent Application No. 201580072964.X, dated May 28, 2018, 15 pages (9 pages of English Translation and 6 pages of Office Action).

* cited by examiner

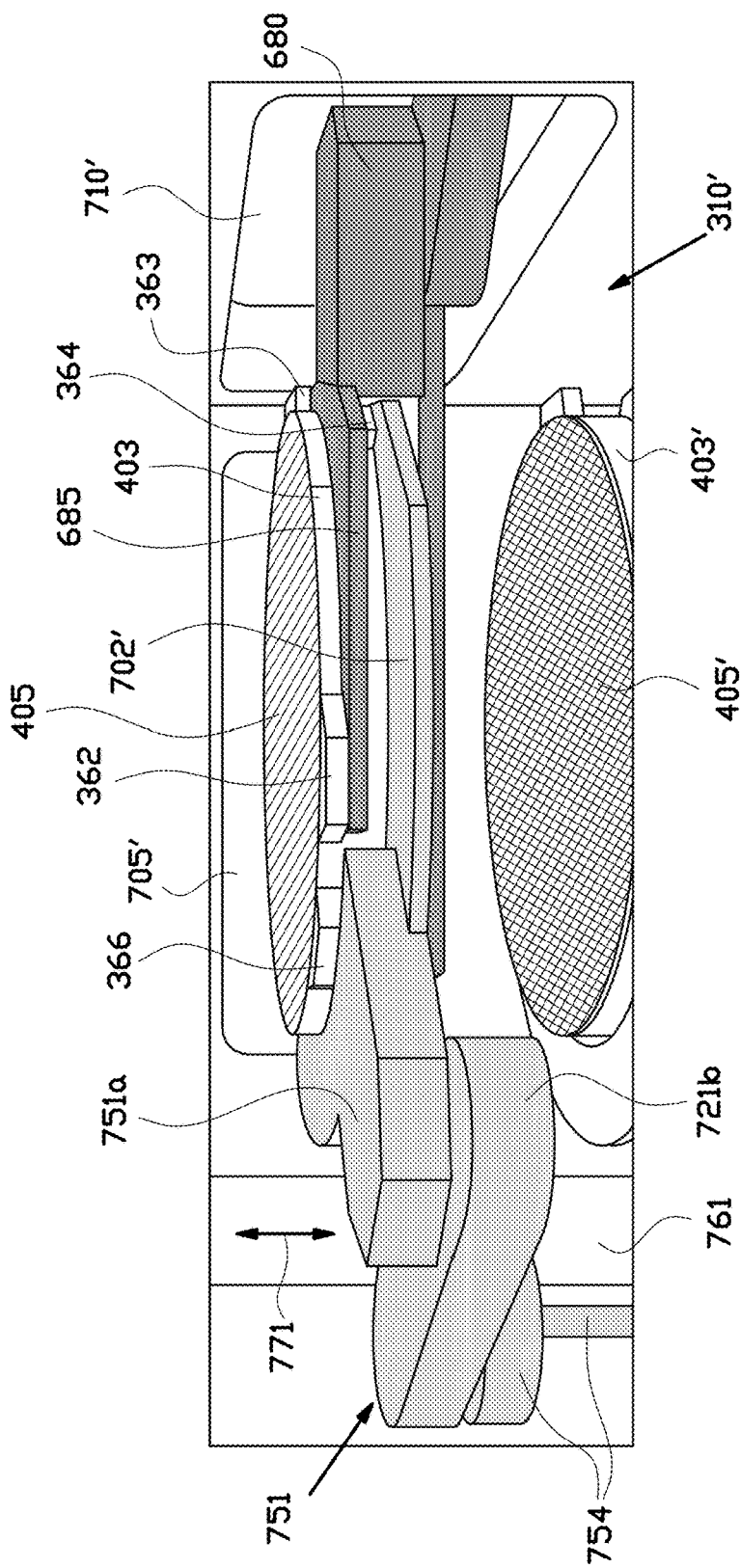

LOAD LOCK SYSTEM AND METHOD FOR TRANSFERRING SUBSTRATES IN A LITHOGRAPHY SYSTEM

BACKGROUND

Field of the Invention

The present invention relates to an apparatus and a method for transferring substrates into and from a processing in a lithography apparatus.

Description of Related Art

WO 2012/146789 discloses a known system comprising a load lock chamber with a substrate handling robot comprising a robot arm. The robot arm comprises:

a handling body which is arranged for holding a substrate support structure which is arranged to clamp a substrate thereon, a base that is movable along a rail oriented in a substantially vertical direction, and a section connected to the base and the handling body, that enables the robot arm to translate and rotate a substrate clamped on a substrate support structure in a two-dimensional plane.

The substrate handling robot is arranged to receive a substrate clamped on a substrate support structure, and to transfer the clamped substrate towards a lithography apparatus which is arranged adjacent to the load lock chamber. The robot arm is arranged to reach out of the load lock chamber via a passage, and to transfer a clamped substrate to be processed towards the lithography apparatus. Similarly, the robot arm receives processed clamped substrates from the lithography apparatus, in order to move them back into the load lock chamber.

A drawback of the known system is that the jointed robot arm does not provide a stable and robust mechanism to transfer substrates. Moreover, the jointed robot arm requires a complex control system and several motors to control the individual sections of the arm and thus the motion of the substrate during transfer.

It is an object of the invention to provide a load lock system and lithography system which at least partially overcomes this drawback.

SUMMARY OF THE INVENTION

To this end, according to a first aspect the present invention provides a load lock system for transferring a substrate into and out of a lithography system, the load lock system comprising:

a load lock chamber provided with an opening in the load lock chamber for allowing passage of the substrate from within the load lock chamber to outside of the load lock chamber, and a transfer apparatus comprising a sub-frame at least partially arranged in the load lock chamber, an arm which is, with a proximal end thereof, connected to the sub-frame, and a substrate receiving unit which is connected to a distal end of the arm, wherein the arm comprises at least three hinging arm parts, wherein a first and a second arm part of said three hinging arm parts are hingedly connected to the sub-frame with a proximal end of the first and second arm parts, and wherein a third arm part of said three hinging arm parts is hingedly connected to the distal ends of the first and second arm parts respectively, wherein the at least three hinging arm parts are arranged to form an at least four-bar linkage which is arranged to guide the arm in a predetermined transfer motion for moving at least part of the substrate receiving unit through the opening.

According to the invention the arm comprises at least three hinging parts which are arranged to form an at least four-bar linkage. Such a four-bar linkage consists of four rigid linkages. In the arrangement of the present invention, the sub-frame comprises hinge points, also denoted as anchor points, which are arranged for connecting the first and second arm parts to the sub-frame. The part of the sub-frame between the hinge points provides a ground linkage for the four-bar linkage. The first and second arm parts provide two adjacent links which extend from the sub-frame towards the third arm part. The third arm part is provided with hinge points which are arranged for connecting to the first and second arm parts. The part of the third arm between the hinge points provides a further link for the four-bar linkage.

The four-bar linkage of the transfer device provides a very stable and robust mechanism with low deflection of the arm for transferring a substrate through the opening of the load lock chamber. Furthermore such deflection, if any, shows low hysteresis due to the increased stiffness of the four-bar linkage.

In addition, the four-bar linkage requires that only one of the arm parts need to be driven for moving the substrate receiving unit at the distal end of the arm. The actual path, along which the substrate receiving unit moves when one of the arm parts is driven, depends inter alia on the dimensions, in particular the lengths, of the individual links of the four-bar linkage. Thus the actual path is preselected during the design of the four-bar linkage, and the transfer device according to the invention does not require a complex control system and several motors to control the individual sections of the arm.

In an embodiment, the load lock system further comprises an arm transfer drive for driving the arm for moving at least part of the substrate receiving unit through the opening, wherein the first arm part, in particular the proximal end thereof, is rotationally mounted around an axis, preferably a generally vertical extending axis, and wherein the arm transfer drive is coupled or is arranged to be coupled to said first arm part. The arm transfer drive is arranged for actuating a rotation of the first arm part with respect to the sub-frame. Accordingly the arm transfer drive can suitably be arranged at a substantially fixed position in the load lock chamber. The first arm part can thus be driven by the arm transfer drive in order to drive the arm and move the substrate receiving unit in the predetermined transfer motion through the opening. The arm transfer drive allows the four-bar linkage of the arm to extend and retract while the sub-frame provides a stationary base, and the other arm parts rotating relative to the sub-frame.

Preferably, the four-bar linkage comprises at least three bearings. The bearings provide a suitable way of hinging the arm parts, reduce hysteresis and allow for a smooth rotation of the arm parts, which may in addition reduce particle generation in the hinges interconnecting the arm parts.

In an embodiment, the arm transfer drive is arranged for actuating a rotation of the first arm part with respect to the sub-frame by engaging the first art part at or near its proximate end and driving rotational movement of the first arm part relative to the sub-frame. In this embodiment, the second arm part may have a significantly lower stiffness than the first arm part, as more torque is exerted on the first arm part during driving of the arm. This allows the second arm part to be constructed in a different manner than the first arm part, e.g. the stiffness of the second arm part in the horizontal plane may be less than half the stiffness of the first arm part in a horizontal plane, and/or the weight second arm part may be less, e.g. less than half, than the weight of the first arm part. A relatively low weight of the four-bar linkage is desirable as this reduces the inertia thereof. In an embodiment, the substrate receiving unit is rigidly connected to the third arm part.

Alternatively, in an embodiment, the substrate receiving unit comprises hinge points which are arranged for connecting the first and second arm parts, in particular the distal ends thereof. The part of the substrate receiving unit between the hinge points provides the third arm part for the four-bar linkage.

In an embodiment, the first arm part is connected to the sub-frame and to the third arm part at first hinge points, the second arm part is connected to the sub-frame and to the third arm part at different second hinge points, and the third arm part is connected to the first and second arm parts at third hinge points, wherein the distance between the third hinge points is less than half the distance between the first and/or second hinge points. Preferably, the distance between the third hinge points is less than half or less than one third of the length of the third arm part. Relatively small movements of the first and second arm parts with respect to the sub-frame can thus result in relatively large movement of the third arm part relative to the sub-frame.

In an embodiment, one of the first and second arm parts is arranged at least partially below the other one of the first and second arm parts. This allows said one of the first and second arm parts to obtain a position in which it crosses over the other one of the first and second arm parts. In the position in which the first and second arm parts are at least partially crossed over, the transfer device is in a compact folded position which requires little space. Such a compact folded position allows using a relatively small load lock chamber which saves space. In an embodiment, the second arm part arranged at least partially below the first arm part, preferably such that the first arm part can cross over the second arm part.

In an embodiment, the transfer apparatus is movable between a retracted position and an extended position, wherein in the extended position of the transfer apparatus, the substrate receiving unit is at least partially arranged to pass through the opening. In the retracted position, the transfer apparatus is preferably completely arranged inside the load lock chamber, preferably without contacting a circumferential wall of the load lock chamber.

In an embodiment, the predetermined transfer motion is arranged to provide a substantially linear path, in particular for the substrate receiving unit at or near the opening.

In an embodiment, the first and second arm parts are arranged in a cross-over position in the retracted position.

In an embodiment, the transfer apparatus comprises a first stop unit which defines the extended position. Preferably the first stop unit comprises an end stop, which mechanically limits the movement of the four-bar linkage. The first stop unit prevents the four-bar linkage of the transfer apparatus from moving the substrate receiving unit beyond a certain predetermined position.

In an embodiment, the first stop unit comprises a first stop configuration system for adjusting a position of the first stop unit, in particular the end stop thereof. Accordingly, the end stop position is adjustable, in particular in order to adjust the extended position to bring it in a desired position with respect to the lithography system. In an embodiment, the configuration unit is accessible to an operator for adjusting the four-bar linkage, when the arm is in the extended position.

In an embodiment the first stop unit comprises a first member arranged on the first arm part, and a second member arranged on the second arm part, wherein the first and second member are arranged to abut in the extended position to form the end stop. The first stop unit provides a simple and reliable system for defining the extended position of the transfer apparatus, and to prevent an overshoot of the movement of the transfer apparatus, in particular the substrate receiving unit thereof, without the need for a complex control system.

In an embodiment, the transfer apparatus comprises a second stop unit which defines the retracted position. Preferably the second stop unit comprises a detector for detecting whether or not the transfer apparatus is arranged in the retracted position. In an embodiment the detector is arranged for detecting the presence of an arm part, in particular the first arm part, in the retracted position. In an embodiment the detector is arranged on and/or attached to the sub-frame.

In an embodiment, the second stop unit comprises a second stop configuration system for adjusting a position of the second stop unit, in particular the detector thereof. Accordingly, the detector position is adjustable, in particular in order to adjust the retracted position to bring it in a desired position with respect to the load lock chamber, in particular in order to allow a further robot to remove a substrate from the substrate receiving unit or to the place a substrate into or onto the substrate receiving unit.

In an embodiment the detector of the second stop unit, is arranged to detect the presence of the first or second member of the first stop unit in the retracted position.

Though, in an embodiment described above, the first stop unit comprises a mechanical end stop, in an alternative embodiment the first stop unit may be provided with a detector for detecting the presence of an arm part as in the second stop unit.

Likewise, in an embodiment described above, the second stop unit may comprise such a detector. Alternatively, the second stop unit may be provided with an end stop as in the first stop unit.

In an embodiment the load lock system and the processing chamber are, at least during transfer of a substrate, mutually connected, e.g. by means of a screw connection or an interlocking connection. The mutual connection is preferably a rigid connection so that the relative position of the load lock system and the processing chamber remains substantially constant during transfer of the substrate.

In an embodiment, both the load lock chamber and the vacuum chamber of the lithography system are supported by a common rigid base plate. Especially when the load lock chamber and the processing chamber are separate parts that are not fixedly attached to one another, this substantially reduces and/or prevents changes in relative position there between at least during transfer of a substrate. For instance, the load lock system may be arranged to be moved relative to the processing chamber, in particular when no substrate is being transferred. Even small changes in this relative position, i.e. due to vibrations or sagging of the floor, negatively influence the accuracy with which a substrate can be positioned in the processing chamber, which typically has to be positioned with an accuracy of 0.2 mm or less. The present embodiment improves the stability of the relative position, allowing more accurate positioning during transfer of the substrate from the vacuum chamber to the load lock chamber and vice versa.

In an embodiment, the sub-frame is movable relative to the load lock chamber along a substantially vertical axis. According to this embodiment, the sub-frame is arranged to be movable relative to the load lock chamber, to allow positioning of the transfer apparatus at a suitable height in the load lock chamber to allow transfer of the substrate through the opening. Preferably, the vertical axis is provided by a vertical support, e.g. a vertical rail, that is rigidly connected to a rigid base plate as described above, so that the relative position of the support, the processing chamber and the load lock chamber, at least during movement of the sub-frame along the vertical axis, is substantially fixed, e.g. substantially not influenced by external vibrations and/or sagging of a floor on which the lithography apparatus is installed. In an embodiment, the sub-frame is arranged on a movable carrier, wherein the load lock system comprises a sub-frame drive, coupled to said movable carrier for driving movement of the sub-frame relative to said load lock chamber along the substantially vertical axis.

In an embodiment, the opening is arranged at an operational height, and the load lock system further comprises an arm transfer drive for providing a drive force for driving the transfer motion of the arm, wherein the sub-frame is movable relative to the arm transfer drive along said substantially vertical axis for moving the substrate receiving unit between the operational height and a non-operational height different from said operational height, wherein the arm transfer drive is arranged such that movement of the sub-frame relative to the arm transfer drive along the substantially vertical axis from the non-operational height to the operational height causes the arm transfer drive to couple to the arm for transmitting the drive force to the arm, and wherein the arm transfer drive is arranged such that movement of said sub-frame relative to the arm transfer drive along said substantially vertical axis from the operational height to said non-operational height causes the arm transfer drive to uncouple from the arm.

In an embodiment, the load lock system comprises a sub-frame locking system for preventing the sub-frame to be moved in the vertical direction unless the transfer apparatus is in the retracted position in the load lock chamber. In addition or alternatively, the sub-frame locking system is arranged for locking the position of the sub-frame along the vertical axis, at least during and/or before a movement of the transfer apparatus away from the retracted position. The sub-frame locking system thus prevents movement of the sub-frame when the transfer apparatus is not in the retracted position, and inter alia prevents damage to the transfer apparatus and/or the load lock chamber.

In an embodiment, the transfer apparatus comprises a transfer locking system for holding the transfer apparatus in the retracted position in the load lock chamber. The load lock system is arranged for locking the four-bar linkage in the retracted position, prior to and/or during a movement of the sub-frame along the substantially vertical axis. By holding or locking the transfer apparatus in the retracted position, the arm can be moved in the along the substantially vertical axis without contacting the load lock chamber, thus preventing damage.

Preferably, in the retracted and locked state of the transfer apparatus, the substrate receiving unit is in a position to receive a substrate to be processed from outside the load lock chamber through a second opening in the load lock chamber, and to deliver a processed substrate to a further substrate handling device which removes the processed substrate from the load lock chamber via the second opening.

In an embodiment, at least one arm part of each of the arm parts comprises a configuration unit arranged for adjustment of a length of at least one of said arm parts. This enables the adjustment of the four-bar linkage, in particular to fine tune the path of the substrate receiving unit during its movement between the extended and retracted position.

In an embodiment, the transfer apparatus is a first transfer apparatus, and wherein the load lock system further comprises a second transfer apparatus, wherein the second transfer apparatus comprises a sub-frame at least partially arranged in the load lock chamber, an arm which is, with a proximal end thereof, connected to the sub-frame, and a substrate receiving unit which is connected to a distal end of the arm, wherein the arm comprises at least three hinging arm parts, wherein a first and a second arm part of said three hinging arm parts are hingedly connected to the sub-frame with a proximal end of the first and second arm parts, and wherein a third arm part of said three hinging arm parts is hingedly connected to the distal ends of the first and second arm parts respectively, wherein the at least three hinging arm parts are arranged to form an at least four-bar linkage which is arranged to guide the arm in a predetermined transfer motion for moving at least part of the substrate receiving unit through the opening.

The second transfer apparatus is preferably implemented in the same way as the first transfer apparatus. Both the first and second transfer apparatuses may be positioned at a suitable position in relation to the opening to move the respective substrate receiving unit into and out of the load lock chamber through the opening. Providing two transfer apparatuses allows to move a first substrate through the opening by the first transfer apparatus, while at the same time the second transfer unit receives or delivers a second substrate, and vice versa. Processing two substrates in the load lock system simultaneously in this manner increases the throughput of the system.

In an embodiment the second transfer apparatus is arranged substantially vertically below the first transfer apparatus. By arranging the first and second transfer apparatus is substantially different horizontal planes, any interference of the first and second transfer apparatuses is at least substantially prevented. In addition, arranging the first transfer device above the second transfer device provides for a very compact assembly.

In an embodiment, the sub-frame of the second transfer apparatus is arranged on a movable carrier. Preferably, both sub-frames of the first and second transfer apparatuses are both arranged on the movable carrier, i.e. on the same moveable carrier. The movable carrier allows to alternatively position the first and second transfer apparatus at the level of the opening, by moving the sub-frames along the substantially vertical axis. When the first transfer apparatus is positioned at the height of the opening, the second transfer apparatus is below the level of the opening and is not in a position for moving a substrate through the opening. In this situation, the first transfer apparatus transfers a processed substrate from the lithography system into the load lock chamber. Subsequently, the first and second transfer apparatuses are moved in a vertical direction to position the second transfer apparatus holding a substrate to be processed at the level of the opening. Subsequently the second transfer apparatus delivers the substrate to be processed to the lithography system and retracts back into the load lock chamber. Now the opening can be closed allowing the processing of the substrate by the lithography system. During the processing by the lithography system, the second transfer device receives a new substrate from outside the load lock chamber through the second opening in the load lock chamber, whereas the processed substrate from the first transfer device is removed from the load lock chamber for further processing. In the example operation as described above, the functioning of the first and second transfer apparatuses can be reversed or alternated.

In an embodiment, the load lock system comprises a particle shield extending in a plane between the first and second transfer apparatuses. Preferably the particle shield is arranged to extend at least partially above the substrate receiving unit of the second transfer apparatus, in particular when the second transfer apparatus is in the retracted position. The particle shield is arranged to extend in a plane between the at least two transfer apparatuses for shielding the lower transfer apparatus of the at least two transfer apparatuses, and a substrate thereon, from particles. The particle shield thus prevents particles generated by the bearings and surfaces of the upper transfer apparatus to fall onto the lower transfer apparatus and onto a substrate on the substrate receiving unit of the lower transfer apparatus. This has the advantage of preventing contamination of a substrate placed on at least the lower second transfer apparatus. In addition, the particle shield prevents that the lower transfer apparatus transfers any contamination outside the load lock chamber, in particular it prevents the transfer of contamination from the load lock system into the lithography system.

In an embodiment the particle shield is supported by the sub-frame and/or movable carrier. Preferably the particle shield is attached to the sub-frame of the first or second transfer apparatus and/or to the movable carrier. Accordingly the particle shield is arranged to move together with the first and second transfer apparatuses along the substantially vertical axis. The movement of the particle shield matches a substantially vertical movement of the transfer apparatuses, thus preventing the transfer apparatuses and the shield from colliding and causing damage.

According to a second aspect, the present invention provides a lithography system comprising a load lock system as described above. The invention thus provides an improved interface for loading substrates into and out of the lithography system for processing.

In an embodiment, the lithography system comprises a vacuum chamber arranged outside of and/or adjacent to said load lock chamber, wherein the opening is a passage between the vacuum chamber of the lithography system and the load lock system. In this manner, substrates may be loaded via the load lock system into the vacuum chamber for processing. After processing, the substrates may be removed via the load lock system from the vacuum chamber. A typical example of a lithography system which comprises a vacuum chamber which can be coupled to the load lock system is a charged particle lithography system, preferably using multiple electron beams, for patterning a target, e.g. such as the lithography system shown in FIG. 2.

According to a third aspect, the present invention provides a method of loading a substrate into a lithography system from a load lock system, wherein the load lock system comprises a load lock chamber and a transfer apparatus comprising a sub-frame at least partially arranged in the load lock chamber, an arm which is, with a proximal end thereof, movably connected to the sub-frame, and a substrate receiving unit which is connected to a distal end of the arm, wherein the method comprises the steps of:

receiving a substrate on the substrate receiving unit of the transfer apparatus in the load lock chamber;

extending the transfer apparatus in order to transfer at least part of the substrate receiving unit with the substrate through an opening between the load lock chamber and the lithography system;

placing the substrate in the lithography system;

retracting the transfer apparatus from the lithography system back into the load lock chamber; and closing the opening;

wherein the arm comprises an at least four-bar linkage, which is arranged to guide the arm and the substrate receiving unit in a predetermined transfer motion when extending and retracting the transfer apparatus.

The method provides a way to load substrates from and into a lithography system. The substrates are transferred by a transfer apparatus through an opening, in a predetermined transfer motion. The four-bar linkage of the transfer device provides a very stable and robust mechanism with low deflection of the arm for transferring a substrate through the opening of the load lock chamber. In addition, the four-bar linkage requires that only one of the arm parts need to be driven for moving the substrate receiving unit at the distal end of the arm along the predetermined transfer motion. The actual path of the transfer motion is preselected during the design of the four-bar linkage, and the transfer device according to the invention does not require a complex control system and several motors to control the individual sections of the arm.

In an embodiment wherein the lithography system further comprises a vacuum chamber, the method further comprising the step of:

reducing the pressure in the load lock chamber and opening the opening to the vacuum chamber before the substrate is transferred into the vacuum chamber.

Before the opening is opened the load lock chamber is brought to a vacuum pressure that is substantially the same as the vacuum pressure in the vacuum chamber. In this manner, substrates may be placed in a vacuum chamber of a lithography system.

It is noted that the predetermined transfer motion allows a reduction of the volume of the load lock chamber. Advantageously, when the lithography system is a charged particle system or EUV system comprising a vacuum chamber, a smaller volume of the load lock chamber will reduce the time required to achieve vacuum in the load lock chamber, which is required in order to enable the opening between the load lock chamber and the vacuum chamber to be opened and to at least substantially maintain the vacuum condition inside the vacuum chamber.

In an embodiment of the method, the load lock system comprises a load lock system as described above, or according to one of the embodiments of the load lock system as described above.

According to a fourth aspect of the invention, the invention provides a load lock system for a lithography system, wherein the lithography system is adapted for processing a substrate, the load lock system comprising:

a load lock chamber provided with an opening at an operational height for allowing passage of the substrate from within the load lock chamber to outside of the load lock chamber, a load lock transfer apparatus at least partially arranged in the load lock chamber, comprising an arm for receiving the substrate and for transferring said substrate through the opening, wherein the arm is movable within the load lock chamber along a substantially vertical axis between the operational height and a non-operational height different from said operational height, an arm transfer drive for providing a drive force for driving a transfer movement of the arm through the opening, wherein the arm is movable relative to the arm transfer drive along said substantially vertical axis, wherein the arm transfer drive is arranged such that movement of the arm relative to the arm transfer drive along the substantially vertical axis from the non-operational height to the operational height causes the arm transfer drive to couple to the arm for transmitting the drive force to the arm, and wherein the arm transfer drive is arranged such that movement of said arm relative to the arm transfer drive along said substantially vertical axis from the operational height to said non-operational height causes the arm transfer drive to uncouple from the arm.

The invention thus provides a simple and compact way of coupling and uncoupling the arm transfer drive from the arm by moving the arm along the vertical axis relative to the arm transfer drive. When the arm is not at the operational height, and the arm transfer drive is uncoupled from the arm, no drive force is transmitted from the arm transfer drive to the arm. In this manner, even when the arm transfer drive is activated while the arm is not at operational height, the arm is not driven by the drive force, preventing damage to the arm, substrate and/or load lock chamber. When the arm transfer drive is coupled to the arm when the arm is at the operational height, the arm transfer drive may either be activated for providing the drive force, or not. Though according to the present invention an operational height is provided at the height of the opening, the system may comprise multiple operational heights, at which the arm transfer drive can transmit its drive force to the arm.

Preferably, when viewed along the vertical axis, the arm transfer drive is mounted at a fixed position with respect to the load lock chamber. It is thus not necessary to move the arm transfer drive vertically with respect to the load lock chamber to couple or uncouple the arm transfer drive to or from the arm.

In an embodiment, the load lock system further comprises an arm transfer transmission unit for transmitting the drive force of the arm transfer drive to the arm. Such an arm transfer transmission unit allows more flexibility in the placement of the arm transfer drive, for instance outside the load lock chamber or at the operational height. A more compact load lock chamber may thus be constructed which is of particular importance when the load lock chamber is to be operated at a vacuum.

In an embodiment, the arm transfer drive comprises a keyed joint, comprising a shaft having a key and wherein the arm comprises a respective key seat for coupling the arm transfer drive to the arm. In an embodiment, the key is arranged at or near the operational height. The arm transfer transmission unit is provided for transmitting drive force at the keyed joint. The load lock transfer apparatus allows switching of the coupling of the transmission unit to the arm, here by moving the arm to operational height. The key of the keyed joint remains at operational height, while the other arm is brought to operational height and its key seat is brought into engagement with the key to form the keyed joint. The coupling and decoupling is provided at the operational height. A preferred example of a key seat to be used in the present invention is a pinion fitting. In an alternative embodiment the arm comprises a key and the shaft comprises a key seat.

In an embodiment, the transfer movement of the arm comprises extension and/or retraction of the arm, preferably in a substantially horizontal plane. Extending and retracting the arm in a substantially horizontal plane provides a way to transfer the substrate into and out of the load lock chamber. In the retracted state the arm and/or substrate thereon may move along the substantially vertical axis without contacting the load lock chamber, in particular the load lock chamber walls. In the extended state the substrate may pass through the opening.

In an embodiment, the load lock system is provided with a sensor for sensing if the arm is retracted. A suitable sensor is positioned to detect the position of the arm. If the arm is retracted, movement of the arm along the substantially vertical axis is allowed. Preferably, the sensor is spaced apart from the arm, for instance mounted in a suitable position on the inside of the load lock chamber for determining whether the arm is retracted. Alternatively the sensor may for instance comprise a mechanical switch that is fixed to the arm.

In an embodiment, the arm is a first arm and the load lock transfer apparatus further comprises a second arm spaced apart from the first arm along the substantially vertical axis;

wherein the second arm is movable within the load lock chamber along said substantially vertical axis between the operational height and a non-operational height different from said operational height;

wherein the arm transfer drive is further arranged for providing a drive force for driving a transfer movement of the second arm through the opening;

wherein the second arm is movable relative to said arm transfer drive along said substantially vertical axis, wherein the arm transfer drive is arranged such that movement of the second arm relative to the arm transfer drive along the substantially vertical axis from the non-operational height to the operational height causes the arm transfer drive to couple to the second arm for transmitting the drive force to the arm, and wherein the arm transfer drive is arranged such that movement of said second arm relative to the arm transfer drive along said substantially vertical axis from the operational height to said non-operational height causes the arm transfer drive to uncouple from the second arm.

When the second arm is at the operational height the second arm may be driven to transfer a substrate through the opening, while at the same time the first arm at a non-operational height, may receive a substrate through a second opening in the load lock chamber that is at the non-operational height, and vice versa. This increases the throughput of the system.

In an embodiment, the second arm comprises a key seat for engaging the key of the keyed joint of the arm transfer transmission unit for transmitting the drive force of to the second arm when the second arm is at operational height. The arm transfer transmission unit provides the driving force at the keyed joint. The apparatus allows switching of the coupling of the transmission unit between the first arm and the second arm. The key of the keyed joint remains at operational height, while the other arm is brought to operational height and its key seat is brought into engagement with the key to form the keyed joint. The coupling and decoupling is provided at the operational height, which ensures that only a single arm can be extended to pick or place. The key seat of the second arm typically has the same shape and dimension as the key seat of the first arm. In an alternative embodiment the second arm comprises a key and the shaft comprises a key seat.

A preferred example of a key seat to be used in the present invention is a pinion fitting.

In an embodiment, the arm transfer drive comprises a single motor for driving the transfer movement of the first and the second arm, at least the one of said first and second arm which is coupled to the arm transfer drive. The use of a single motor reduces the complexity and size of the load lock system.

In an embodiment, the load lock transfer apparatus comprises a sub-frame, wherein both the first arm and the second arm are carried by said sub-frame, and wherein the sub-frame is movable along the substantially vertical axis to position either the first arm or the second arm at the operational height. The both the first and second arms are mounted onto the sub-frame, so that vertical movement of the sub-frame causes a corresponding vertical movement of both arms in the vertical direction in the lock load chamber. Accordingly, the arms are moved together in the vertical direction, for example using a single drive, for switching the drive force between the first arm and the second arm.

Preferably, the load lock chamber comprises a vertical rail which coincides with the vertical axis, and the common sub-frame is mounted on the rail and is movable along said rail.

In an embodiment, the first arm and the second arm are arranged a fixed distance to each other along the substantially vertical axis. In this manner, the first arm and the second arm are movable in conjunction along the vertical axis without the need for individual control of the vertical position of both the arms.

In an embodiment, the sub-frame is provided with a sub-frame locking system for locking the position of the sub-frame along the vertical axis, at least when one of the arms is extended. The load lock system is arranged for locking a position of the sub-frame along the vertical axis. The lock thus prevents movement of the sub-frame when one of the arms is extended or retracted through the opening. The sub-frame locking system thus prevents damage to the sub-frame, the arms and/or the load lock chamber since no movement of the sub-frame is possible in the vertical direction when one of the arms is used for handling or moving a substrate.

In an embodiment the arm transfer drive is at least partially arranged outside the load lock chamber, and wherein the arm transfer drive preferably comprises a vacuum seal. By placing the arm transfer drive at least partially outside the load lock chamber a more compact load lock chamber may be constructed.

In a preferred embodiment the load lock chamber is connected to a vacuum pump which may be part of the load lock system or the lithography system. The time required to achieve vacuum in the load lock chamber is typically smaller the smaller the volume of the load lock system.

According to a fifth aspect, the present invention provides a lithography system comprising a load lock system or an embodiment thereof as described above. The invention thus provides an interface for loading substrates into and out of the lithography system for processing.

In an embodiment the lithography system further comprises a vacuum chamber arranged outside of said load lock chamber, and the opening is a passage between the vacuum chamber of the lithography system and the load lock system.

In this manner substrates may be loaded via the load lock system into the vacuum chamber for processing. After processing, the substrates may be removed via the load lock system from the vacuum chamber. A typical example of a lithography system which comprises a vacuum chamber which can be coupled to the load lock system is a charged particle lithography system, preferably using one or more electron beams, for patterning a target, e.g. such as the lithography system shown in FIG. 2.

According to a sixth aspect, the invention provides a method of using a load lock for a lithography system, wherein the lithography system is adapted for processing a substrate, the load lock system comprising:

a load lock chamber provided with an opening at an operational height for allowing passage of the substrate from within the load lock chamber to outside of the load lock chamber, a load lock transfer apparatus at least partially arranged in the load lock chamber, comprising an arm for receiving the substrate and for transferring said substrate through the opening, wherein the arm is movable within the load lock chamber along a substantially vertical axis between the operational height and a non-operational height different from said operational height, and an arm transfer drive for providing a drive force for driving a transfer movement of the arm through the opening, wherein said method comprises the steps of:

moving the arm along the substantially vertical axis from the non-operational height to the operational height for coupling the arm to the arm transfer drive, and moving the arm along the substantially vertical axis from the operational height to the non-operational height for uncoupling the arm from the arm transfer drive, or vice versa.

When the arm is not at the operational height the arm transfer drive is thus uncoupled from the arm so that no drive force is transmitted from the arm transfer drive to the arm. In this manner, even when the arm transfer drive is activated while the arm is not at operational height, the arm is not driven by the drive force thus preventing damage to the arm, substrate and load lock chamber. The invention thus provides a simple way of coupling an uncoupling the arm transfer drive from the arm by moving the arm along the vertical axis relative to the arm transfer drive.

In an embodiment, the arm of the load lock transfer apparatus is a first arm, said load lock transfer apparatus further comprising a second arm movable relative to said the arm transfer drive along said substantially vertical axis for coupling said second arm to the arm transfer drive when the second arm is at the operational height and for uncoupling the second arm from the arm transfer drive when the second arm is at a non-operational height different from said operational height, wherein during said moving of the first arm from or to the operational height the first arm and the second arm are moved in conjunction to move the second arm to or from the operational height respectively. For instance, coupling of the arm transfer drive, e.g. via an arm transfer transmission unit as described herein, to the first arm may be switched to the second arm, by vertical movement of both arms. It will be appreciated that first the first arm may be moved to the operational height, followed by the second arm, or the other way around.

Preferably the method is carried out using a load lock system as described herein which is provided with a sub-frame and a keyed joint between the arm transfer drive and the arm. When either the first or second arm is moved away from the operational height, the keyed joint preferably remains at the operational height, while the other arm is brought to operational height and is brought into engagement with the keyed joint.

In a preferred embodiment the distance between the first arm and the second arm along the vertical axis is constant during said vertical movement of said arms.

Preferably, a sub-frame as described herein may be used to move the first arm and the second arm in conjunction.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 6B shows a more detailed view of the load lock system depicted in FIG. 6A.

Although embodiments of the invention will be described with reference to the drawings, the invention is not limited to the embodiments as shown. It will be clear that various embodiments are possible within the scope of the invention. Any of the features, implicitly or explicitly described or illustrated here can combined. Specifically continuation or divisional applications can be filed directed at any one of the advantageous effects described, implicit or explicit herein, by any of the combination of features.

DESCRIPTION OF ILLUSTRATIVE EMBODIMENTS

The following is a description of various embodiments of the invention, given by way of example only and with reference to the drawings.

Figure 1:
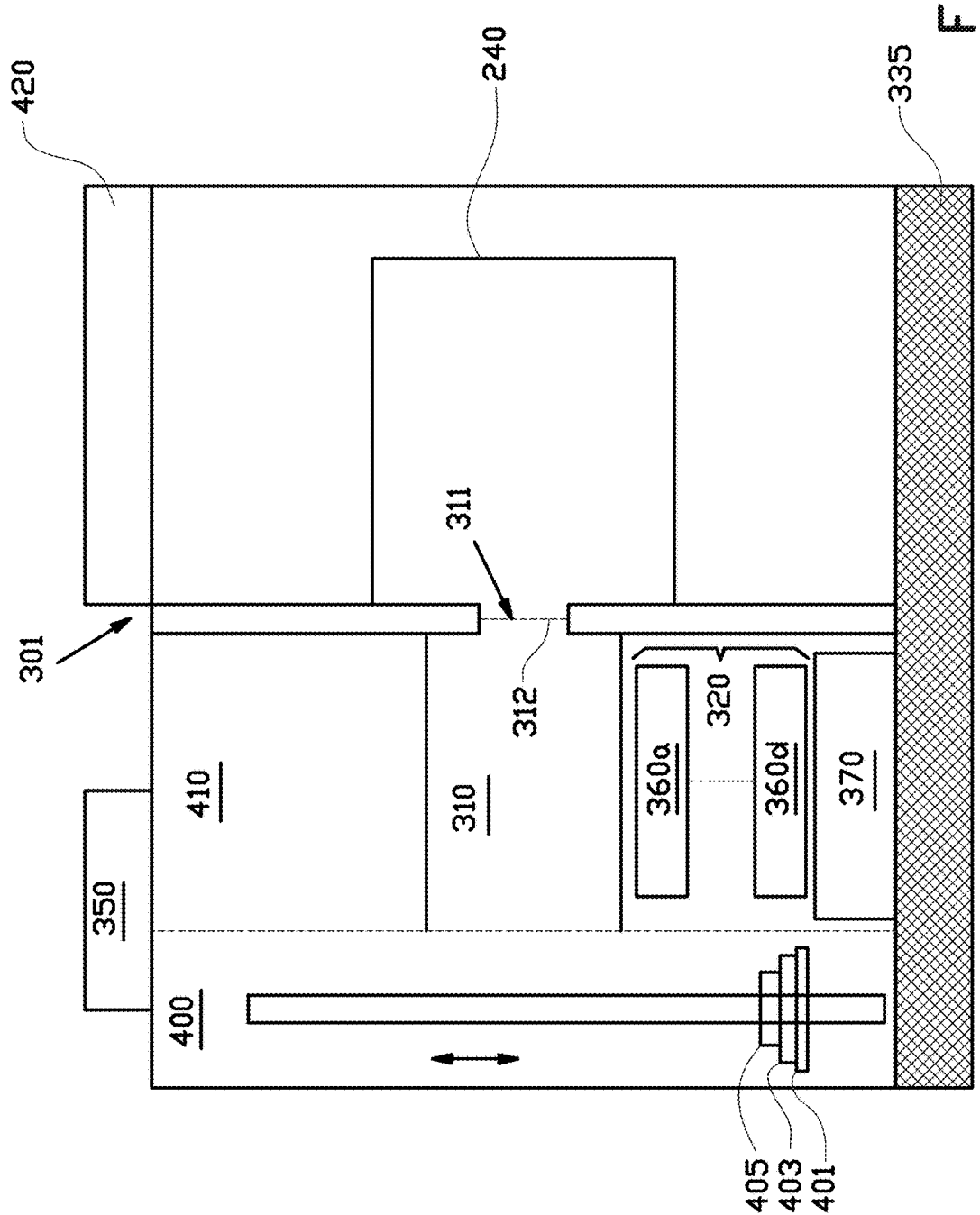
FIG. 1 schematically shows an example of a lithography apparatus with a load lock system, FIG. 2 schematically shows a load lock transfer apparatus according to an embodiment of the invention.

FIG. 1 schematically shows a lithography apparatus 301 arranged on a common rigid base plate 335. The lithography apparatus 301 comprises a load lock system 310 for transferring substrates into and out of a processing chamber 240 of said lithography apparatus 301. FIG. 1 further schematically shows that electronics 420 needed to ensure proper operation of the lithography apparatus is optionally placed on top of the lithography apparatus 301.

In case the lithography apparatus 301 comprises a charged particle or an Extreme Ultra Violet (EUV) lithography system, the processing chamber 240 is in the form of a vacuum chamber. In a charged particle lithography apparatus charged particles such as electrons, are used to form patterns on a substrate, for example a wafer. In a charged particle lithography apparatus, a vacuum environment is required to prevent damage to the charged particle source, or dispersal of the charged particle beams which negatively impacts the exposure of the pattern. Photolithography systems such as EUV systems which use EUV light to form patterns on the substrate also require a vacuum environment to prevent absorption of the EUV light which negatively impacts the exposure. Other lithography systems do not necessarily require a vacuum environment for operation, however a controlled environment typically is still required for processing the substrate, to prevent contamination of the substrate.

Processing substrates in a vacuum or controlled environment requires that substrates are transferred into the processing chamber before processing, and out of the processing chamber after processing.

In case the processing chamber is a vacuum chamber, it is required to vent the system, or part thereof, to atmospheric pressure before transferring a substrate into the vacuum chamber, and it is necessary to pump down the system, or part thereof, to a vacuum after the substrate has been delivered into the vacuum chamber. Transferring the substrate out of the vacuum chamber requires the same steps.

Instead of venting and pumping down the vacuum chamber 240, the load lock system 310 preferably comprises a load lock chamber suitable for the pump down and venting actions. For the pump down action the system 310 comprises pumps for pumping down the pressure within a load lock chamber to a reduced pressure, e.g. a vacuum suitable for transfer of a substrate and substrate support to the lithography apparatus 301. For the venting action the load lock system 310 comprises vents for venting the load lock chamber to increase the pressure after processing of the clamped substrate in the lithography apparatus 301.

The load lock system 310 thus forms an interface to a vacuum environment within the vacuum chamber 240. The load lock system 310 is typically used for pump down action and the venting action described above. For this purpose, the load lock system 310 comprises one or more load lock chambers in which the pressure is regulated.

By maintaining a controlled environment in the load lock chamber it is not necessary to vent the vacuum chamber and subsequently pump down the vacuum chamber to a suitable vacuum again each time a substrate is loaded. Instead, only the much smaller volume of the load lock chambers needs to be vented and subsequently brought to a suitable vacuum again. This significantly reduces the time required for loading a substrate and reduces the chance that particles contaminate the vacuum chamber.

Before entry into the processing chamber 240, a substrate typically undergoes the actions of clamping, pre-alignment and pump down in case the processing chamber 240 is a vacuum chamber.

In this context, clamping is defined as providing a substrate on a substrate support structure to form a single structure, which can be handled as one unit. Furthermore, the term "clamped substrate" is used to refer to a substrate being clamped to a substrate support structure. Furthermore, the term "substrate" is used to refer to a substrate being clamped to a substrate support structure or to a substrate that is not clamped. For lithography applications, the substrate usually comprises a wafer provided with a charged-particle sensitive layer or resist layer.

Clamping and/or unclamping is for example performed in the preparation system 320. Alternatively, the clamping is performed at a different location prior to providing the substrate to the preparation system 320, for example within the substrate transfer system. In yet another alternative, clamping and/or unclamping is performed within the load lock system 310. Clamping and unclamping is for example performed in separate units, but may also be executed in the same unit. Hereinafter the expression "clamping unit" refers to a unit for clamping and/or unclamping.

FIG. 1 further schematically shows a preparation system 320 that includes a number of substrate preparation units 360*a*-360*d*. In this embodiment, a clamped substrate is formed in a suitable substrate preparation unit 360*a*-360*d* in the preparation system 320 and then inserted into the vacuum chamber 240 via the load lock chamber. After patterning of the substrate by the lithography apparatus, the clamped substrate is transferred back to a suitable substrate preparation unit 360*a*-*d* in the preparation system 320 via the load lock chamber for unclamping.

The load lock system 310 comprises at least one load lock chamber 310 comprising at least one opening 311 with a respective door 312, connecting the load lock chamber 310 with the processing chamber 240 of the lithography apparatus. The position of the load lock system 310 relative to the processing chamber 240 during transfer of a substrate from the load lock chamber to the processing chamber is substantially fixed as both are supported by the rigid base plate 335. This allows accurate positioning of substrate in the processing chamber when the substrate is transferred thereto from the load lock chamber.

As shown in FIG. 1 a transfer between the load lock system 310 and the processing chamber 240 is generally a horizontal transfer. A suitable transfer apparatus that carries the substrate and/or clamped substrate is used to provide the transfer.

Pre-alignment relates to aligning the substrate and/or clamped substrate such that patterning is performed onto a predetermined portion of the substrate in a certain orientation. Pre-alignment is sometimes needed to ensure that the position and/or orientation of the substrate on the substrate support structure are suitable and reproducible for accurate exposure within the lithography apparatus. The preparation system 320 optionally includes a pre-alignment unit 370 for pre-aligning the substrate before entry into the vacuum chamber 240 via the load lock system 310.

Pump down relates to the step of reducing the pressure surrounding the substrate to minimize contamination and to reduce the influence of the substrate on the vacuum chamber pressure upon insertion into the lithography apparatus 301. Preferably, the load lock chamber of the load lock system 310 is arranged to perform the pump down action.

A lithography apparatus 301 optionally comprises a storage unit 410 for temporarily storing substrates. The stored substrates are for example substrates that still need to be patterned by the lithography apparatus. Alternatively or additionally, the substrate storage unit 410 is arranged to store patterned substrates awaiting transfer via a substrate transfer system 350. After the patterning action performed by the lithography apparatus 301, the substrate is typically exposed to a venting action, and an unclamping action, i.e. separating the substrate from the substrate support structure. In between the venting and unclamping actions, the substrate is transferred.

According to an embodiment of the invention a group of lithography apparatuses are clustered to form a lithography system, as also described in International Patent Publication WO 2012/146789, which is incorporated herein by reference. The lithography system optionally comprises a substrate supply system. The substrate supply system is arranged to receive substrates to be processed by the lithography system, and to provide these substrates to the individual lithography apparatuses in the lithography system for processing. A substrate transfer system, such as a suitable conveyor system extending in a horizontal direction, is arranged to receive substrates from and/or send substrates to the substrate supply system. When the lithography apparatus is used in a single, stand-alone configuration, a substrate supply system is optionally still used.

In the example shown in FIG. 1, the lithography system comprises a robot that operates within a robot space 400, which is arranged to transfer substrates and/or clamped substrates between different units as described below. The robot comprises a carrier 401 which is movable in a substantially vertical direction. Therefore, said robot will hereafter be referred to as Vertical Transfer Robot (VTR). The carrier 401 is arranged for suitably transporting substrates and/or clamped substrates between the load lock system 310, the substrate preparation units 360*a*-360*d*, and the pre-alignment unit 370. Optionally, the robot 401 is further arranged to handle substrate exchange with the substrate transfer system 350. In FIG. 1 the carrier 401 carries a clamped substrate comprising a substrate support structure 403 with a substrate 405 clamped thereon.

In an embodiment the vertical transfer robot comprises an arm having carrier 401. The arm is extendable and retractable in a substantially horizontal plane. By extracting or retracting the arm the clamped substrate 403, 405 and/or substrate 405 is picked up or positioned in any of the substrate preparation units 360*a*-360*d*, pre-alignment unit 370, storage unit 410 or load lock system 310.

Figure 2:
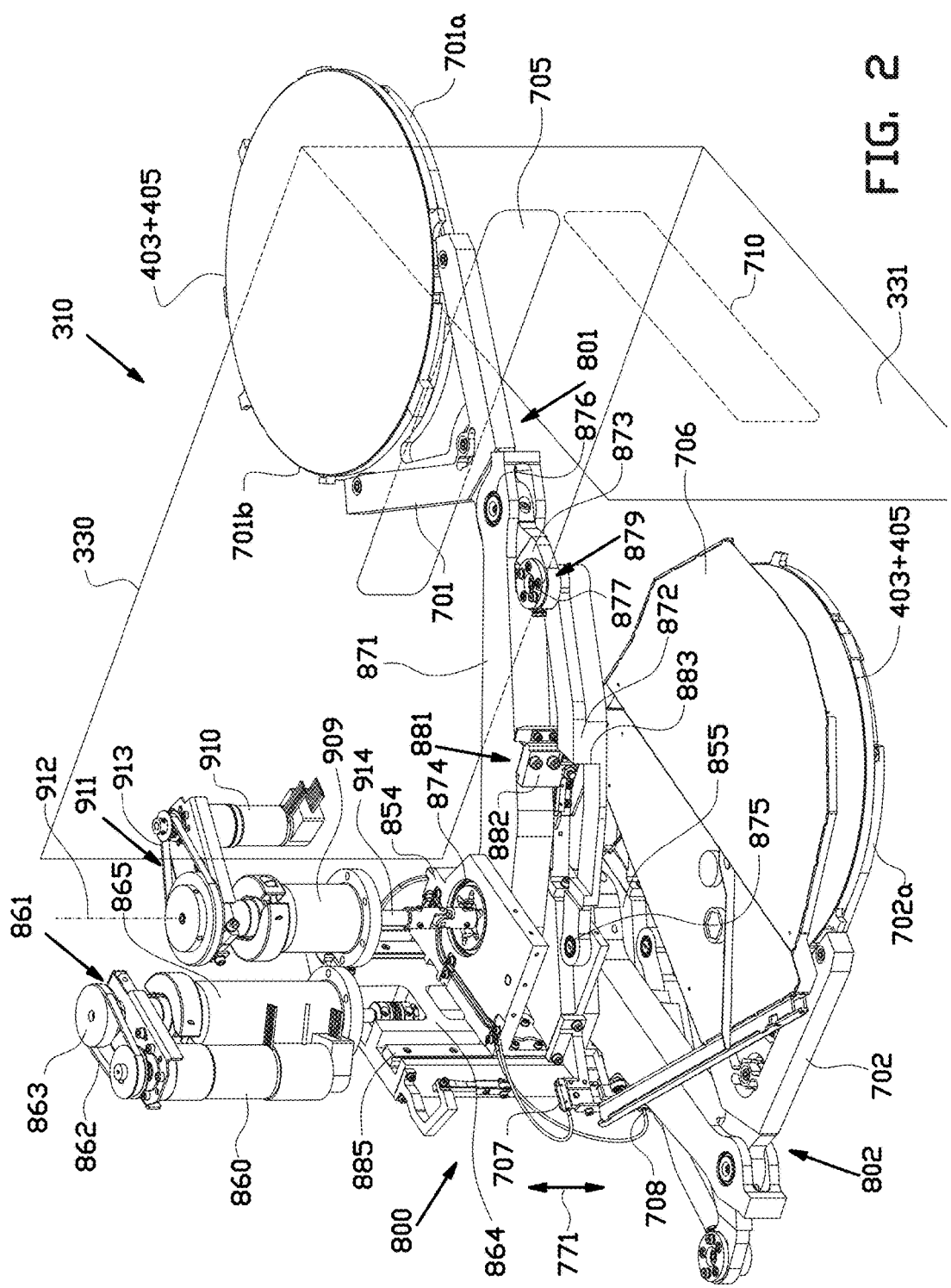

FIG. 2 schematically shows an example of a load lock system 310 according to the invention. The load lock system comprises a load lock chamber, of which only two side walls 330, 331 are shown in FIG. 2. A first side wall 330 is provided with a first opening 705 which provides a passage towards the lithography apparatus (not shown). A second side wall 331 is arranged with a second opening 710 which provides a passage for the VTR, for example, inside the load lock chamber.

In the example shown in FIG. 2, the load lock system 310 comprises two transfer apparatuses, which are arranged at least partially inside the load lock chamber. Each one of said transfer apparatuses comprises a sub-frame 854, 855 at least partially arranged in the load lock chamber, an arm 801, 802 which is, with a proximal end thereof, connected to the sub-frame 854, 855, and a substrate receiving unit 701, 702 which is connected to a distal end of the arm 801, 802. As indicated in FIG. 2, the second transfer apparatus 855, 802, 702 is arranged substantially vertically below the first transfer apparatus 854, 801, 701. The second transfer apparatus 855, 802, 702 is implemented in the same way as the first transfer apparatus 854, 801, 701. In particular, the two transfer apparatuses are at least substantially of equal design, and therefore the individual components of said transfer apparatuses are described below with reference to the first transfer apparatus 854, 801, 701.

The arm 801 of the first transfer apparatus of FIG. 2 comprises a mechanism comprising four bars, i.e. a four-bar linkage. In particular, wherein the arm 801 comprises at least three hinging arm parts 871, 872, 873. A first arm part 871 and a second arm part 872 of said three hinging arm parts are hingedly connected to the sub-frame 854 with a proximal end thereof. A third arm part 873 of said three hinging arm parts is hingedly connected to the distal ends of the first arm part 871 and second arm part 872, respectively. The at least three hinging arm parts 871, 872, 873 are arranged to form a four-bar linkage which is arranged to guide the arm 801 in a predetermined transfer motion for moving at least part of the substrate receiving unit 701 through the opening 705. As indicated in FIG. 2, the four-bar linkage comprises four hinge points 874, 875, 876, 877. One of these hinge points 874 is connectable to arm transfer drive 910 as described in more detail below, whereas the other hinge points 875, 876, 877 are each provided with a bearing. In the example of FIG. 2, the arm transfer drive 910 (a brushless motor) is provided, preferably positioned outside of the load lock chamber. An arm transfer transmission unit 911 transmits a drive force of arm transfer drive 910 to a driving shaft 914. In case the load lock chamber needs to be arranged to sustain a vacuum pressure, a suitable (e.g. rotational) vacuum seal 909 is used to seal the transmission unit 911 to maintain the vacuum in the load lock chamber, while providing a rotationally fixed coupling between the arm transfer drive 910 outside the load lock chamber to the driving shaft 914 inside the load lock chamber. The driving shaft 914 transmits a drive force of the arm transfer drive 910 onto the first arm part 871, which will rotate around axis 912. The arm transfer transmission unit 911 optionally comprises a belt transmission 913. In the shown example a belt 913 is used to limit the vertical dimension of the shaft 914 extended by the drive 910.

The substrate receiving unit 701 is rigidly connected to the third arm part 873. The substrate receiving unit 701 comprises two hinge points 876, 877 which are arranged for connecting the first arm part 871 and second arm part 872, in particular the distal ends thereof.

As schematically shown in FIG. 2, the first part 871 is arranged above the second arm part 872. In particular, the first arm part 871 and the second arm part 872 are arranged to enable the first arm part 871 to cross over the second arm 872, as schematically indicated in FIG. 2 with reference to the second transfer device 855, 802, 702.

Furthermore, the first and second transfer apparatus are each is movable between a retracted position and an extended position. In FIG. 2, the first transfer apparatus 854, 801, 701 is shown in the extended position, wherein the substrate receiving unit 701 is at least partially arranged to pass through the opening 705. The second transfer apparatus 855, 802, 702 is shown in the retracted position, wherein the transfer apparatus is completely arranged inside the load lock chamber. The first and second arm parts of the arm 802 are arranged in a cross-over position in the retracted position.

The transfer apparatus further comprises a first stop unit 881 which defines the extended position. In particular, the first stop unit 881 comprises an end stop 882, 883, which mechanically limits the movement of the four-bar linkage. In particular, the first stop unit 881 comprises a first member 882 arranged on the first arm part 871, and a second member 883 arranged on the second arm part 872. The first member 882 and second member 883 are arranged to abut in the extended position to form the end stop.

In this situation, the drive force of the arm transfer drive keeps the first member 882 and the second member 883 abutted against each other. Alternatively, or additionally, each arm is provided with a locking mechanism on the sub-frame is used to lock the arm in the extended position. The locking mechanism moves with the sub-frame along the substantially vertical axis. When the arm is in locked in the extended position, the drive force of the arm transfer drive is not needed to keep the arm extended and the arm transfer drive is switched of. Alternatively or additionally, the locking mechanism or an additional, second locking mechanism is used to hold the arm in the retracted position. When the arm is locked in the retracted position the drive force of the arm transfer drive is not needed to keep the arm retracted and the arm transfer drive is switched of. Locking the arms in position and at the same time switching off the arm transfer drive reduces particle generation between the keyed seat and the key of the keyed joint when the sub-frame is moved along the substantially vertical axis, since no drive force is present between the keyed seat and the key.

As schematically indicated in FIG. 2, the second member 883 comprises a substantially vertical extending edge or rim, which is formed as a whole with the second arm member 872. The first member 882 is fixed to the first arm part 871 via a screw connection, which allows adjusting the position of the first member 882 on the first arm part 871. The screw connection thus provides a simple embodiment of a first stop configuration system for adjusting a position of the first stop unit 881, in particular the first member 882 of the end stop.

The configurable stop unit 881 prevents the four-bar linkage from moving beyond a certain predetermined position and allows configuration of the stop should the position of the stop be adjusted. The stop unit 881 is optionally configured such that the substrate receiving unit 701 at the extension of the arm 801 is stopped in a predetermined position, which hold the clamped substrate 403, 405 in a desired position in the processing chamber of the lithography apparatus. Using a stop in combination with an arm that is arranged to perform a predetermined path, provides a reliable system for positioning the arm 801, and the substrate receiving unit 701 for placing or picking up a substrate 405 or a clamped substrate 403, 405 inside the processing chamber. The stop unit 881 replaces any complex positioning of a robot arm in combination with position checks using suitable complex sensors.

The transfer apparatus further comprises a second stop unit which defines the retracted position. The second stop unit comprises a detector 707 for detecting whether or not the transfer apparatus is arranged in the retracted position. In particular, the detector 707 is arranged for detecting the presence of an arm part, in particular the first arm part 872, in the retracted position. The detector 707, 708 is for example included as a sensor to sense if the arm is retracted. When the arm is in the retracted position, the sub-frame is allowed to move. The detector 707 is fixed to the sub-frame 854, in particular at a side of said sub-frame 854 facing away from the opening 705. The detector 707 is fixed to the sub-frame 854 via a screw connection, which allows adjusting the position of the detector 707 with respect to the sub-frame 854. Thus the screw connection provides a simple embodiment of a second stop configuration system for adjusting a position of the second stop unit, in particular the detector 707 thereof.

In the particular example as shown in FIG. 2, the detector 707 of the second stop unit, is arranged to detect the presence of the first member 882 of the first stop unit in the retracted position.

Furthermore, as shown in the example of FIG. 2, the sub-frame 854 is movable relative to the load lock chamber in a substantially vertical direction 771. The sub-frame 854 is arranged on a movable carrier, which is movable along a rail 885. The load lock system comprises a sub-frame drive or sub-frame displacement drive 860, coupled to said movable carrier for driving movement of the sub-frame 854 relative to said load lock chamber along the substantially vertical axis. In the example of FIG. 2, both sub-frames 854, 855 are arranged and/or mounted on the movable carrier, and are simultaneously movable in a substantially vertical direction 771 along rail 885. In an alternative example, both sub-frames 854, 855 are combined in one single sub-frame unit. In a further example said carrier is provided by the one single sub-frame unit.

The sub-frame displacement drive 860 is arranged to generate a drive force for driving a vertical motion of the sub-frames 854, 855 that is transmitted over a transmission unit 861 via inter alia a belt transmission 862 and an axis 863 to a screw spindle 864. The screw spindle 864 engages on the carrier or on the sub-frames 854, 855. Driving the sub-frame displacement drive 860 will provide a driving force in the vertical direction 771, resulting in the vertical displacement of the sub-frames 854, 855 and both arms 801, 802.

By driving the sub-frames 854, 855, the arms 801, 802 and substrate receiving units 701, 702 are moveable in order to arrange one of the transfer apparatuses to an operational height, that is horizontally at substantially the same level as the opening 705. When one of the transfer apparatuses is arranged at the operational height, for example the first transfer unit as shown in FIG. 2, the arm 801 and the substrate receiving unit 701, which are movable in substantially a horizontal plane, are extendable and retractable in order to move the substrate receiving unit 701 at least partially through the opening 705. Preferably, the drive 860 and several parts of the transmission unit 861 are positioned outside the load lock chamber. In case the load lock chamber needs to be arranged to sustain a vacuum pressure, a suitable (e.g. rotational) vacuum seal 865 is used to seal the transmission unit 861 to maintain the vacuum in the load lock chamber, while driving the vertical displacement of the sub-frames 854, 855 using the sub-frame displacement drive 860 arranged outside said load lock chamber.

When one of the transfer apparatuses is arranged at substantially the same level as the opening 705 and is arranged in the extended position, the sub-frame displacement drive 860 is restricted to limit the vertical movement of the transfer apparatuses. When the arm 801 is extended and the substrate receiving unit 701 is arranged at the predetermined position with respect to the lithography system, the drive 860 is activated to provide a limited movement of the sub-frame 854 in a vertical direction. By moving the sub-frame 854 upwards, a processed clamped substrate can be picked up from its processing position in the lithography apparatus. By moving the sub-frame 854 downwards, the arm 801 and the substrate receiving unit 701 is lowered to position the clamped substrate in a processing position in the lithography apparatus. Either after picking-up or after positioning the clamped substrate, the arm 801 is retracted inside the load lock chamber. The limited vertical movement at or around the level of the opening 705 provides an operational height range, which range is arranged to allow placing and/or picking-up a clamped substrate in the lithography apparatus. In addition said range is limited in order to prevent the arm 801 or the substrate receiving unit 701 to collide with the wall 330 of the load lock chamber surrounding the opening 705.

However, when the transfer apparatuses need to be moved beyond the operation height range, for example in order to position the second transfer apparatus at the operational height, both transfer apparatuses are arranged in the retracted position inside the load lock chamber. One way to establish whether or not the transfer apparatuses are arranged in the retracted position, is to use the detectors 707, 708 of the respective transfer apparatuses.

In addition or alternatively, the load lock system comprises a sub-frame locking system for preventing the sub-frame to be moved in the vertical direction unless both the transfer apparatuses are in the retracted position in the load lock chamber.

In addition or alternatively, the transfer apparatus comprises a transfer locking system for holding one or both of the transfer apparatuses in the retracted position in the load lock chamber.

As already discussed above, the path of the substrate receiving unit 701 is predetermined by the design of the four-bar linkage. In the example shown in FIG. 2, one of the hinge points 877 comprises a bearing which is attached to the third arm part 873 by means of a screw connection, which allows adjusting the position of the hinge point 877. Adjusting the position of the hinge point 877 can be used to adjust the effective length of second arm part 872 and/or third arm part 873, and thereby to adjust the path of the substrate receiving unit 701 when moving between the retracted and extended position. The screw connection thus provides a simple embodiment of a configuration unit arranged for adjustment of a length of at least one of said arm parts. Accordingly, the example shown in FIG. 2 comprises a configuration unit 879 which allows displacement of the hinge point 877 with respect to arm parts 872, 873, which in turn adjusts the lengths of the second and third arm parts. This allows a small correction/adjustment of the four-bar linkage and the geometry thereof, e.g. to adjust for deviations in the desired predetermined motion and/or the position of the retracted and extended position. In the example of FIG. 2, the configuration unit 879 comprises a fastening means such as a screw to hold the set position of the configuration unit 879 when the hinge point 877 is adjusted to the desired position. Preferably, the configuration unit 879 and the screw are accessible to an operator through the opening 710 when the arm is in the extended position, for adjusting the four-bar linkage.

To prevent particles generated by the bearings and surfaces of arm 801 from falling onto substrate 405 in the substrate receiving unit 702 of the arm 802, a particle shield 706 is placed in between first and second transfer apparatuses. The particle shield 706 extends in a substantially horizontal plane between the first and second transfer apparatuses. As schematically indicated in FIG. 2, the particle shield 706 is arranged to extend at least partially above the substrate receiving unit 702 of the second transfer apparatus, in particular when the second transfer apparatus is in the retracted position. The particle shield 706 is supported by the sub-frame 854, 855 and/or by the movable carrier to allow movement in conjunction with the first and second transfer apparatus, and in particular the sub-frames 854, 855 thereof. This has the advantage of preventing contamination of substrate 405 the substrate receiving unit 702 from contaminants which originate from the first transfer apparatus, for example.

Transfer arms 801, 802 are arranged to extend and retract substrates by moving in a substantially horizontal plane. The first or second transfer apparatus which is arranged at the operating height and in the retracted position, receives clamped substrates to be processed from the VTR 401 via passage 710, and transfers the clamped substrate towards the lithography apparatus via passage 705 in the extended position. Similarly, the first or second transfer apparatus, which is arranged at the operating height and in the extended position, receives processed clamped substrates from the lithography apparatus and moves these into the load lock chamber via passage 705 and to the retracted position. In the retracted position, the processed clamped substrates are handed over to the VTR 401 entering via passage 710.

Each substrate receiving unit is provided with at least two extended portions or fingers 701*a*, 701*b*, 702*a*, 702*b* for carrying a substrate support structure 403 onto which a substrate 405 is clamped. Preferably, the fingers 701*a*, 701*b*, 702*a*, 702*b* are designed to support a substrate support structure 403. The fingers 701*a*, 701*b*, 702*a*, 702*b* have an arched or crescent shape, and have a length that is sufficiently long to extend underneath more than halfway the support structure 403. Preferably the fingers 701*a*, 701*b*, 702*a*, 702*b* extend over more than 240 degrees.

Figure 3:
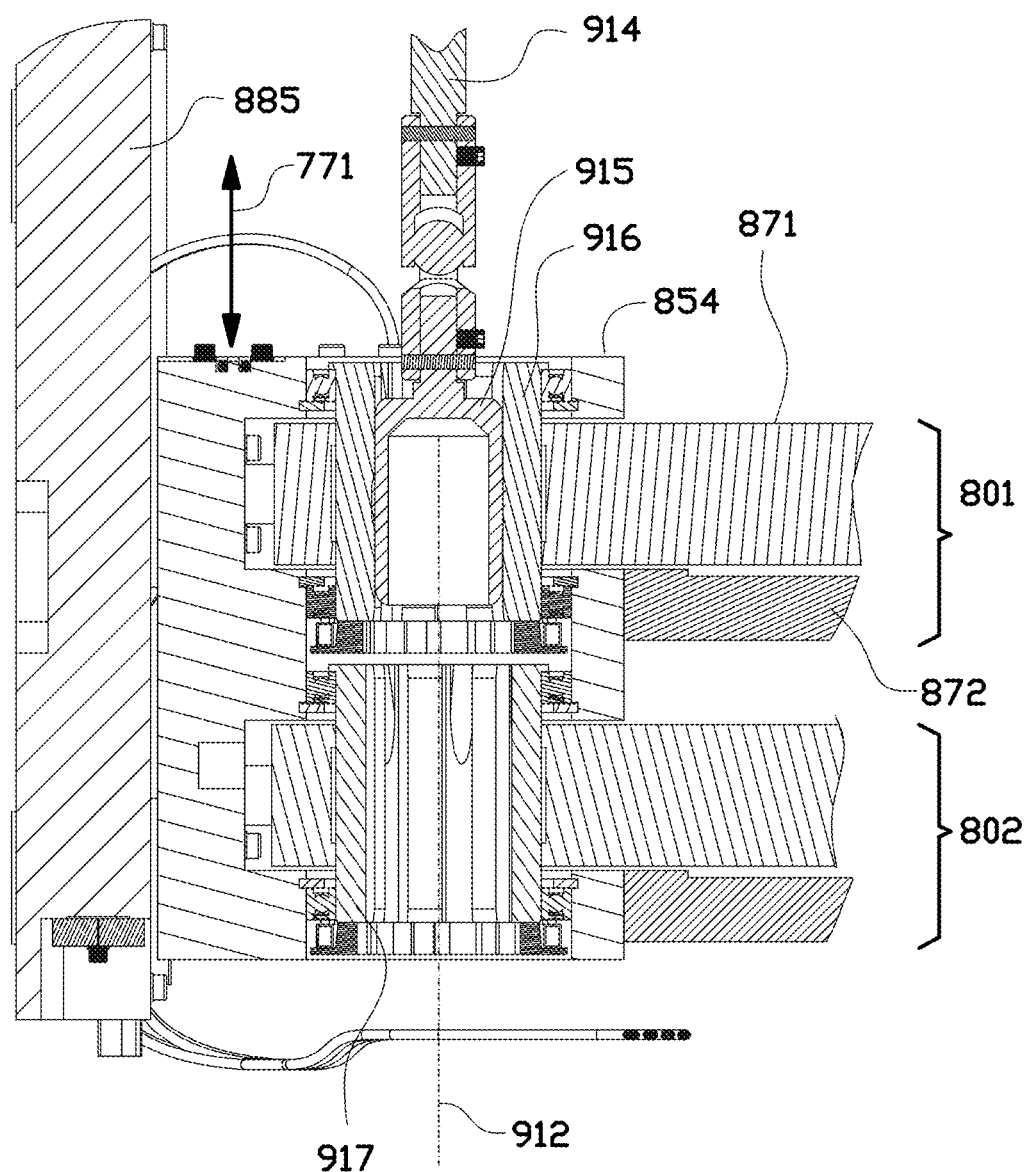
FIG. 3 shows a cross sectional view of a part of a transfer apparatus according to an embodiment of the invention.

FIG. 3 shows a cross-sectional view of the engagement of the transmission unit 911 on the first arm part 872. Near a remote end of the shaft 914 a key 915 is provided.

The cross-sectional view also shows the sub-frame 854 which is movably connected to the rail 885. In the example of FIG. 3, both sub-frames 854, 855 are combined in one single sub-frame unit, forming a common sub-frame, and will hereafter be referred to as sub-frame 854. The load lock transfer apparatus thus comprises a common sub-frame, wherein the first arm and the second arm are carried by said common sub-frame. The first arm and the second arm are arranged at a fixed distance to each other along the substantially vertical axis. The sub-frame is movable along the substantially vertical axis 912 to position either the first arm or the second arm at the operational height. As described above, the sub-frame 854 is movable along said rail 885 in a substantially vertical direction 771. Both arms 801, 802 of the first and second transfer apparatuses are rotatably coupled to the sub-frame by means of suitable bearings which provide a hinge connection between the first arm parts 871 and the sub-frame 854, which enables a hinging action around the axis 912, which is substantially vertical. By moving the sub-frame the arm 801, 802 is movable relative to the arm transfer drive 910 along the substantially vertical axis 912, and the arm transfer drive 910 is arranged such that movement of the arm 801, 802 relative to the arm transfer drive 910 along the substantially vertical axis 912 from the non-operational height to the operational height causes the arm transfer drive 910 to couple to the arm 801, 802 for transmitting the drive force to the arm. The arm transfer drive 910 is arranged such that movement of said arm 801, 802 relative to the arm transfer drive 910 along said substantially vertical axis 912 from the operational height to said non-operational height causes the arm transfer drive 910 to uncouple from the arm 801, 802. When one of the arms 801, 802 is positioned at the non-operational height, the arm transfer drive 910 is uncoupled from that arm and no drive force is transmitted from the arm transfer drive 910 to the arm that is at the non-operational height. When the arm transfer drive is coupled to the arm while the arm is at the operational height, the arm transfer drive is either activated for providing the drive force, or not.

In the embodiment of FIG. 3, the arm is a first arm 801 and the load lock transfer apparatus further comprises a second arm 802 spaced apart from the first arm along the substantially vertical axis 912. The second arm 802 is movable within the load lock chamber with the sub-frame 854 along the substantially vertical axis 912 between the operational height and the non-operational height, which is different from the operational height. The arm transfer drive 910 is arranged for providing a drive force to the second arm for driving a transfer movement of the second arm through the opening when the second arm 802 is at the operational height. The arm transfer drive is arranged such that movement of the second arm relative to the arm transfer drive along the substantially vertical axis from the non-operational height to the operational height causes the arm transfer drive to couple to the second arm for transmitting the drive force to the arm. The arm transfer drive is arranged such that movement of said second arm relative to the arm transfer drive along said substantially vertical axis from the operational height to said non-operational height causes the arm transfer drive to uncouple from the second arm. In this manner, the drive force of the arm transfer drive is switchable between the arms by moving the sub-frame along the substantially vertical axis. Both the first arm parts 871 of the first and second arm 801, 802 are provided with a key seat 916, 917 which are arranged to engage with the key 915 at the end of the shaft 914 to form a keyed joint. FIG. 3 shows a pinion fitting 916, 917 as key seat.

According to the present example, the key 915 is positioned at the operational height. The sub-frame 854 is moveable with respect to the key 915. In the position of the sub-frame 854 as shown in FIG. 3, the upper arm 802 is at operational height, whereas the lower arm 801 is at a lower position. The keyed joint preferably comprises a shaft having a key 915 at the operational height and the arm comprises a respective key seat 916 for coupling the arm transfer transmission unit to the arm. The key 915 engages the key seat 916 that is directly connected to the first arm part 871 of the upper arm 801. The lower arm 802 is also provided with a key seat 917 in an arm part. The lower arm 802 comprises a key seat 917 for engaging the key of the keyed joint of the arm transfer transmission unit for transmitting the drive force of to the second arm when the second arm 802 is at operational height. However in the position of FIG. 3 the arm transfer drive 910 does not engage the key seat 917 of the lower arm 802, since the vertical position of arm 802 of the second transfer apparatus, placed below arm 801 of the first transfer apparatus, does not allow the key 915 to engage the key seat 917 of arm 802 of the second transfer apparatus. The arm transfer drive 910 comprises a single motor for driving the transfer movement of both of the arms. The vertical movement of the sub-frame enables the coupling and uncoupling of the drive force to the arms, so only a single motor is required for driving both arms. An arm transfer transmission unit 911 transmits the drive force of the arm transfer drive 910 to the arm. The arm transfer drive 910 thus provides a drive force to the shaft 914 and the key 915. Only the keyed seat 916 that is positioned at the operational height will engage the key 915 and said key 915 is arranged to drive the arm 801 or 802 which the key seat 916 is connected to the key 915. Preferably, to further prevent particle contamination of the substrate, grease is applied to the key seat 916, 917 and/or the key 915 to reduce friction between these parts when the sub-frame is moved and when the arm transfer drive is active. The reduced friction between the key and the key seat results in reduced particle generation. Alternatively or additionally, the key 915 an the key seat 916, 917 are constructed from a material with a relatively low friction coefficient, relatively low surface roughness and a relatively high surface hardness such as a ceramic material, to further reduce particle generation between the key and the key seat. Alternatively or additionally, the sliding splines of the key and the key seat are included as rolling parts such as bearings, balls or wheels, to reduce friction between the splines by providing a rolling interface between the key and the key seat.

Alternatively, or additionally, the shaft 914 is movable along the substantially vertical axis in conjunction with the sub-frame.

Alternatively, or additionally, part of the shaft 914 comprises a section that is torsionally stiff but axially flexible. This way, forces that occur in the axial direction along the shaft 914 will not result in sliding forces between the keyed seat and the key 915. This further reduces particle generation.

Accordingly a method comprises receiving substrates on any of the arms and driving the arms through the opening to transfer the substrate into or out of the vacuum chamber. The arm transfer drive 910 provides a driving force for both arms 801, 802, preferably for driving the arms 801, 802 individually. The arm transfer transmission unit 911 provides the driving force at the key 915 of the keyed joint. The apparatus allows switching of the coupling of the transmission unit 911 from one arm to the other arm, in particular by moving the sub-frame 854 onto which both arms 801, 802 are mounted. The key 915 of the keyed joint remains at operational height, while the other arm 802 is brought to operational height and the key seat 917 of the other arm 802 is brought into engagement with the key 915.

The method and apparatus provide a mechanical coupling and decoupling of a single arm transfer drive 910 to two independent transfer arms 801, 802. The coupling and decoupling is provided at the operational height, which ensures that only a single arm, which is arranged at the operational height is extendable to pick or place.

When the lower transfer arm 801 is to be extended, first upper transfer arm 802 is retracted. In an example a lock is provided that locks movement of the sub-frame 854 when a transfer arm 801, 802 is extended. This prevents damage to the load-lock transfer apparatus 800.

In the example as shown in FIG. 2, a suitable sensor 707, 708 is positioned to detect the position of the arms 801, 802. The sensor 707, 708 senses if the arm is retracted. If the arms are retracted, sub-frame movement is allowed.

Preferably, the system comprises a controller (not shown) connected to the sub-frame displacement drive 860 and transfer drive 910. The controller is arranged to first actuate the transfer drive 910 to retract the arm. A suitable sensor, for instance a mechanical contact sensor 707 or 708 as shown in FIG. 2, or drive feedback is used to sense that the arm is retracted (e.g. because driving further is blocked). Only then, sub-frame moving is allowed.

When all arms 801, 802 are retracted, sub-frame displacement drive 860 is actuated and the sub-frame 854 moves in a vertical direction 771. Now the other arm is positioned at operational height. The key 915, not connected to the sub-frame, holds its position at operational height. At operational height the key 915 of the transfer arm transmission unit engages onto the key seat 917 of the lower transfer arm 801. Now the driving force of the transfer drive 910 is transmitted onto the lower transfer arm 801, allowing extension and retraction thereof.

Figure 4A:
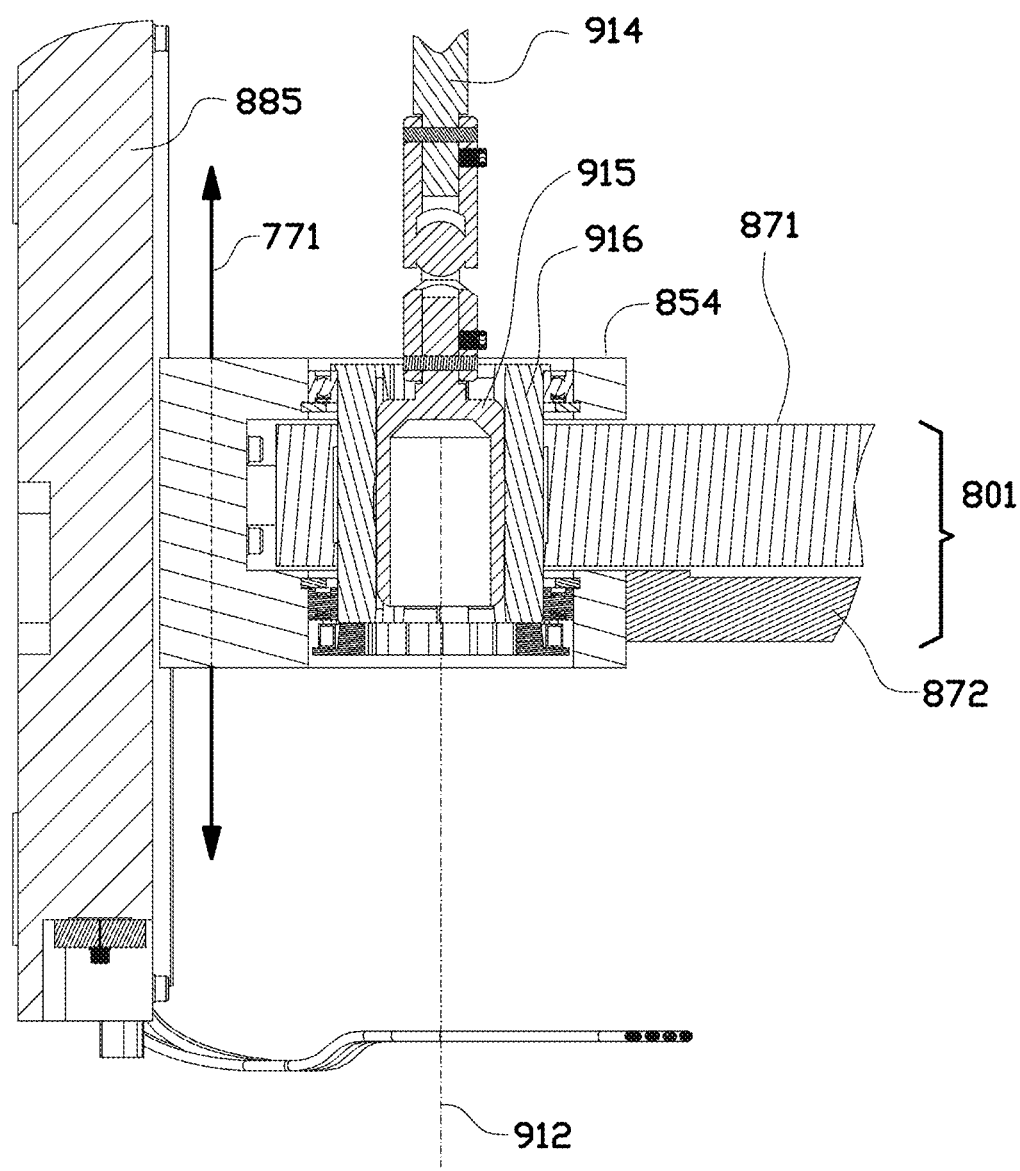
FIGS. 4A and 4B show a cross sectional view of a part of a transfer apparatus according to an embodiment of the invention, FIG. 5 schematically shows a transfer apparatus according to an embodiment of the invention.
Figure 4B:
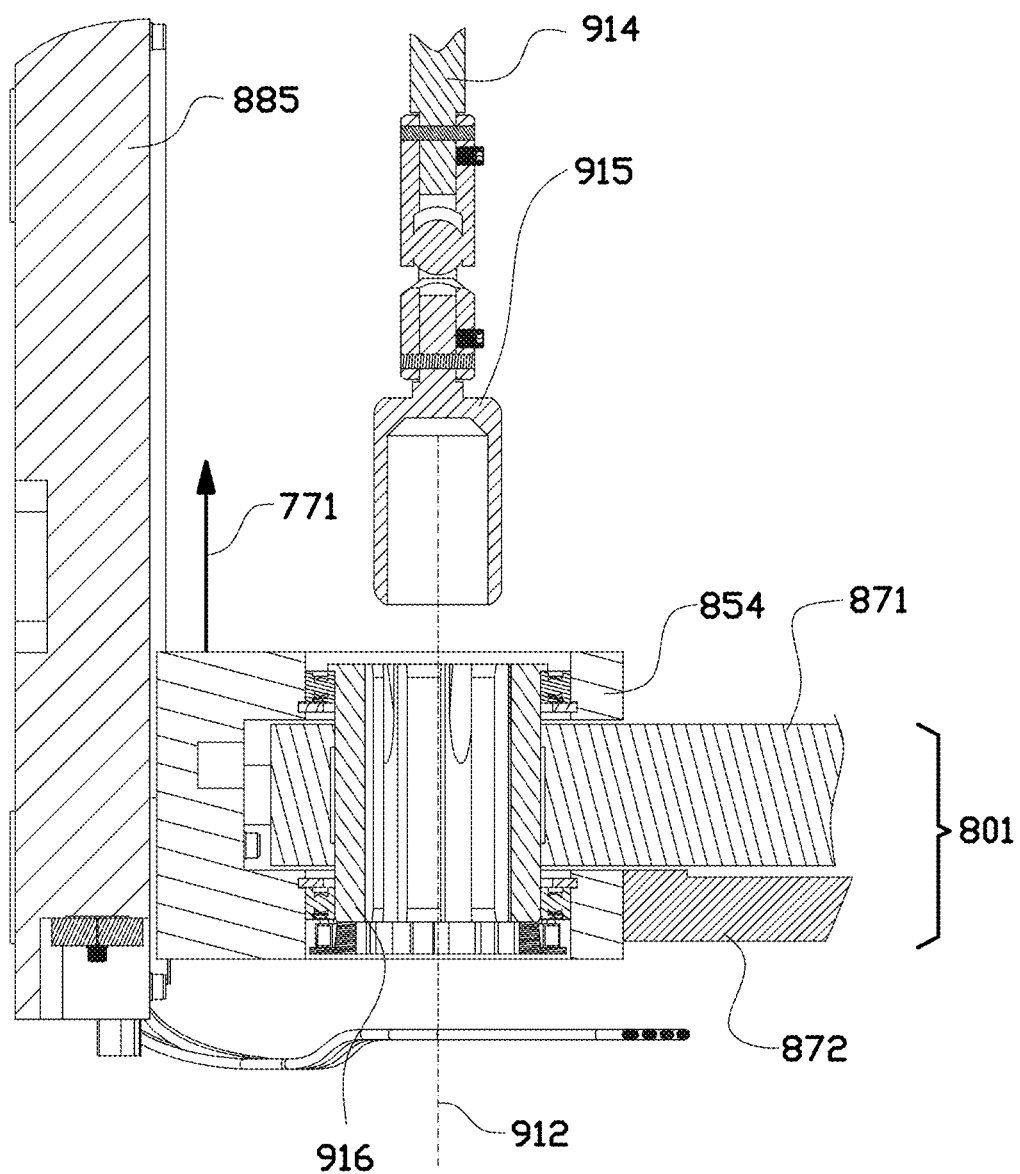

FIGS. 4A and 4B show a cross sectional view of a part of a transfer apparatus according to an embodiment of the invention. In the embodiment of FIGS. 4A and 4B the transfer apparatus comprises a single arm 801. The arm 801, arm transfer drive 910, the shaft 914, key 915 and keyed seat 916 are embodied in the same way as described in FIGS. 2 and 3. As in the embodiment of FIG. 2, an arm transfer drive provides a drive force for driving a transfer movement of the arm through an opening in the load lock chamber. The arm transfer drive is arranged such that movement of the arm relative to the arm transfer drive along the substantially vertical axis from the non-operational height to the operational height causes the arm transfer drive to couple to the arm for transmitting the drive force to the arm. The arm transfer drive is arranged such that movement of said arm relative to the arm transfer drive along said substantially vertical axis from the operational height to said non-operational height causes the arm transfer drive to uncouple from the arm. The arm 801 is movable along a substantially vertical axis 912 between the operational height and the non-operational height which is different from said operational height.

In FIG. 4A, the arm 801 is positioned at the operational height. The key 915 and the key seat 916 are thus in contact and the arm transfer drive is thus coupled to the arm 801. When the arm transfer drive is coupled to the arm 801 while the arm is at the operational height, the arm transfer drive is either activated for providing the drive force, or not.

FIG. 4B schematically shows the arm 801 which has been moved downwards in vertical direction 771 with respect to the position in FIG. 4A to a non-operational height. When the arm 801 is positioned at the non-operational height, the key seat 916 is not in contact with the key 915. The arm transfer drive 910 is thus uncoupled from the arm and no drive force is transmitted from the arm transfer drive to the arm. In this manner, even when the arm transfer drive is activated while the arm is not at the operational height, the arm is not driven by the drive force, preventing damage to the arm, substrate and/or load lock chamber. The transfer apparatus thus provides a reliable way of coupling and uncoupling the arm transfer drive 910 to and from the arm 801 by moving the sub-frame 854 along the substantially vertical axis 912 between the operational height and the non-operational height.

Figure 5:
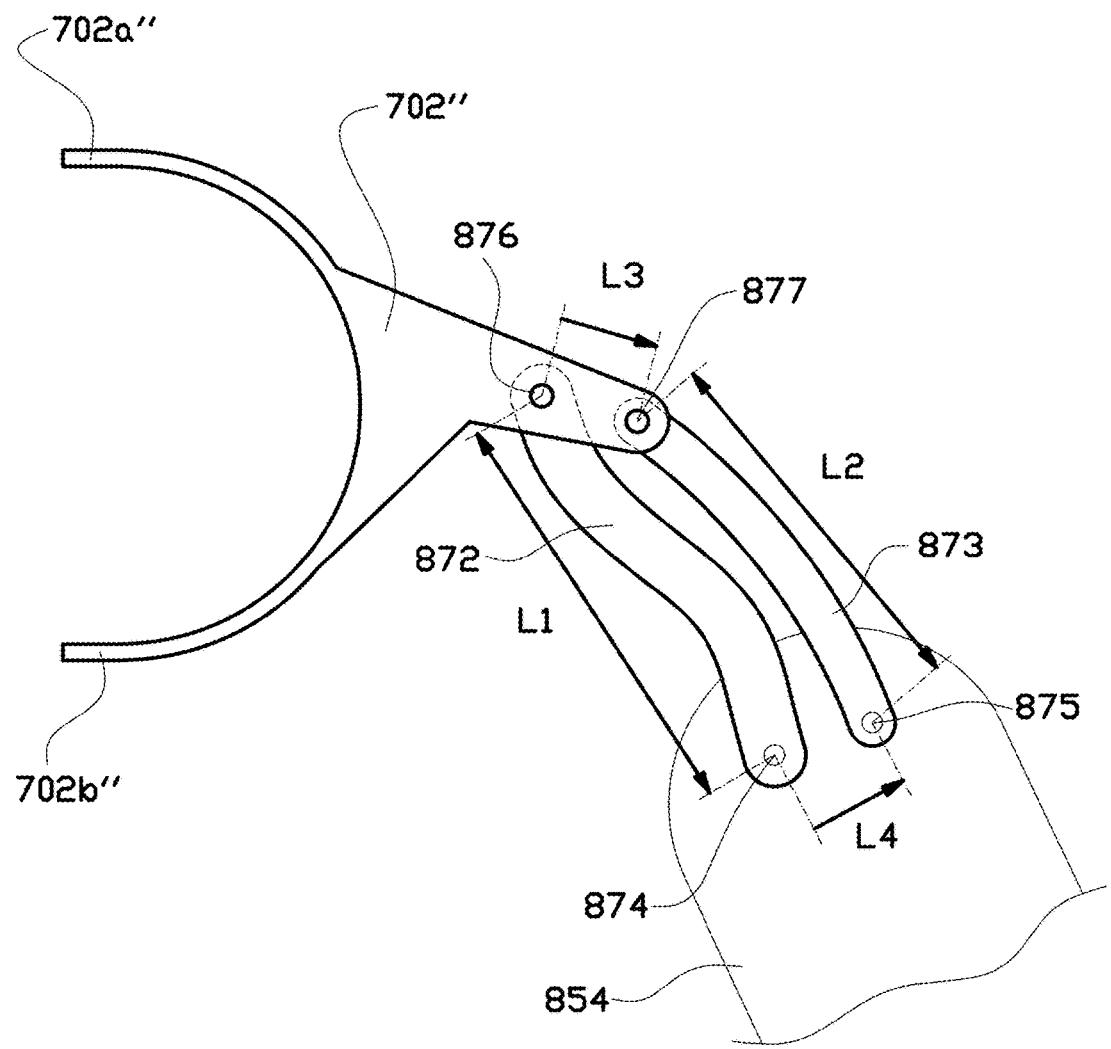

FIG. 5 schematically shows a further example of an arm of the transfer apparatus according to the invention. The arm comprises a four-bar linkage, comprising at least four arm parts or bars that link together to form a said four-bar linkage. The four arm parts are joined together at four hinge points or joints. The four-bar linkage in this embodiment comprises a ground linkage or ground arm fixed to or part of the sub-frame 854. The ground arm part is rotationally and translationally static with respect to the sub-frame 854. A first arm part 872 and a second arm part 873 are hingedly connected to the sub-frame 854 in hinge points 874, 875. The first arm parts 872 and the second arm part 873 need not have the same lengths. The ground arm creates a distance L4 between the hinge points 874, 875. The first arm part 872 and second arm part 873 are connected to a third arm part via hinge points 876, 877, which third arm part is formed by the substrate receiving unit 702". The four arm parts provide respective lengths L1, L2, L3, L4 to the quadrilateral four-bar linkage, which lengths are selected to obtain the desired predetermined transfer motion between a retracted and an extended position.

The four-bar linkage is arranged such that a clamped substrate on the fingers 702a", 702b" of the substrate receiving unit 702" will make a substantially linear motion, at least when approaching the extended position. This allows to move the clamped substrate in a substantially linear motion through the opening 705, 705' of the load lock chamber and/or into the lithography apparatus. In this example the first and second arm parts 872, 873 are arranged at least substantially at the same horizontal level.

Figure 6A:
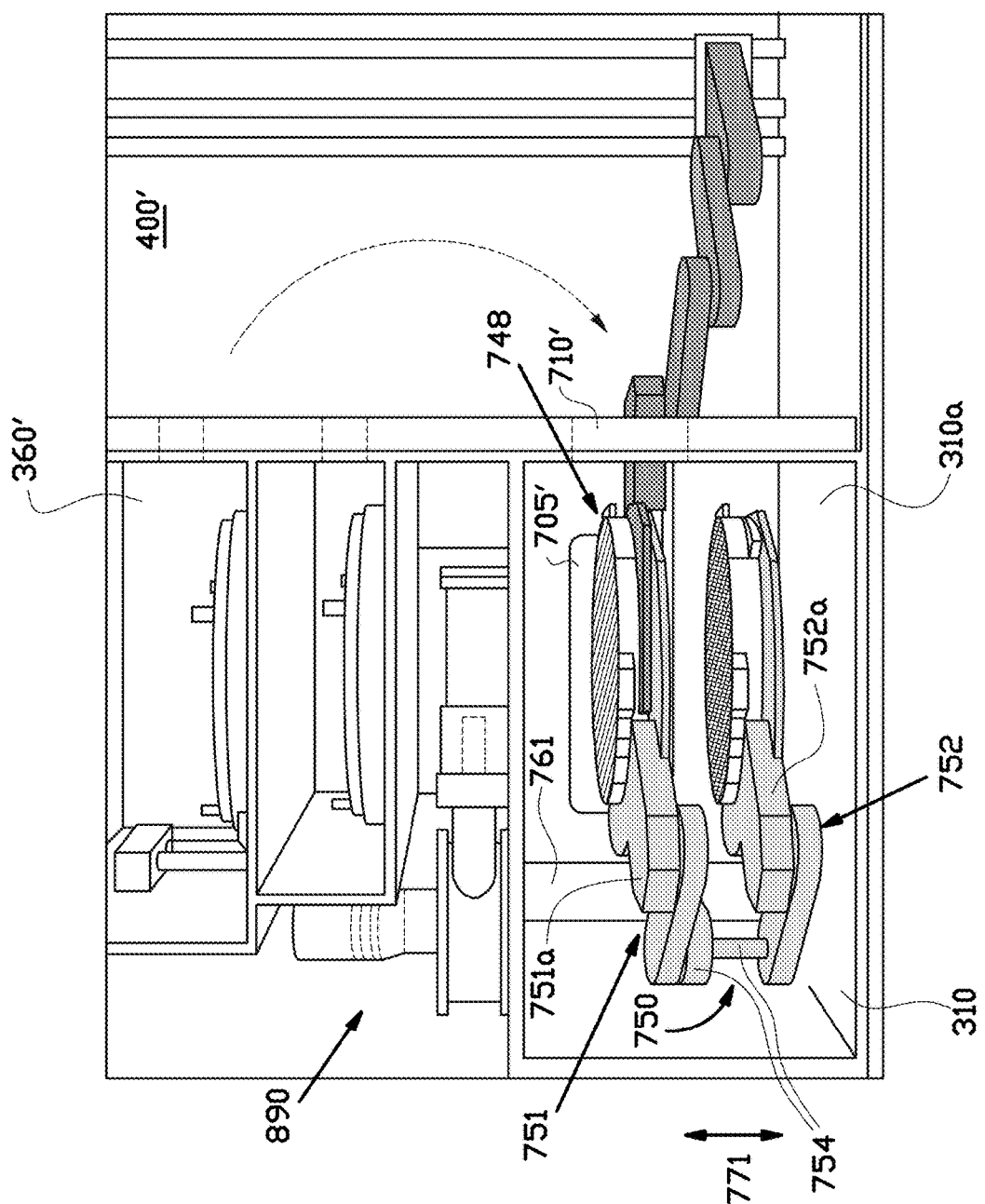
FIG. 6A shows the transfer of a clamped substrate from a substrate preparation unit towards a load lock system according to an embodiment of the invention.

FIG. 6A schematically shows the transfer of the clamped substrate 748 from the substrate preparation unit 360' towards the load lock system 310' having another example of a transfer apparatus 750. The load lock system 310' comprises a transfer apparatus 750 comprising two robot arms 751, 752 each having two handling bodies or substrate receiving units 751a, 752a above each other.

A sub-frame 754 carries both arms 751, 752. The sub-frame 754 is mounted onto a vertical rail 761. The rail 761 forms a vertical rail for driving the sub-frame 754 to move in a substantially vertical direction 771.

Alternatively, the vertical rail 761 is part of and fixed to the sub-frame 754. The sub-frame 754 including the vertical rail 761 is mounted moveably in the load lock chamber 310'.

According to an aspect of the invention, two arms 751, 752 are mounted onto a sub-frame 754 that is mounted movably, in particular movable in the vertical direction 771 in the lock load chamber 310'. This allows moving the sub-frame 754, and subsequently the arms 751, 752 in the vertical direction using a single drive. If a clamped substrate is to be transferred into or from a lithography system which is accessible via the opening 705', the respective arm 751, 752 is moved in a vertical direction 771 to a position which allows extending the arm 751, 752 through the opening. The arms 751, 752 are arranged to perform a substantially horizontal transfer movement through opening 705'. The respective arm 751, 752 extends through an opening 705', a transfer of a clamped substrate is performed, and the respective arm 751, 752 is retracted.

The height at which the arm is operated to transfer a clamped substrate through opening 705' will be indicated as 'operational height' throughout this application. When one of the arms 751, 752 is arranged at the operational height, said one of the arms 751, 752 can be moved the opening 705' either to:
  extend the empty arm 751, 752 through the opening 705' into the adjacent processing chamber of the lithography apparatus;
  transfer a clamped substrate 748 into the processing chamber;
  release or disengage the clamped substrate 748 in the processing chamber;
  engage, preferably lift, a clamped substrate 748 inside the processing chamber;
  transfer a clamped substrate 748 from the processing chamber into the load lock chamber 310';
  retract an empty arm from the processing chamber, via the opening 705', back into the load lock chamber;
  or any combination of any of these actions. In case the lithography system is, for example, a charged particle lithography system, the processing chamber is a vacuum chamber.

FIG. 6B shows a more detailed view of the load lock system 310' at a time just after delivery of the clamped substrate 748 to the upper handling body or substrate receiving unit 751a. The robot arm 751 is attached to the sub-frame 754 that is moveable along a rail 761, the rail 761 being oriented in a substantially vertical direction. The robot arm 751 further comprises a four-bar linkage 721 which is presented in FIGS. 6A and 6B as one section for clarity reasons. The actual embodiment of the four-bar linkage is shown in more detail in FIGS. 2 and 4. The four-bar linkage 721 provides a connection between the sub-frame 754 and the substrate receiving unit 751a, and enables the arm 751 to translate and rotate the clamped substrate 748 in a two-dimensional plane. The clamped substrate 748 is being held by the fingers 702' of the substrate receiving unit 751a.

In the example shown in FIG. 6B, the substrate support structure 403 is provided with lips 362 which are located along a side of the substrate support structure 403, and which arranged to engage with the VTR fingers 685. The substrate support structure 403 is arranged in the VTR such that the lips 362 are arranged at a side facing away from the VTR body 680 (the left side in FIG. 6B). Furthermore, an additional lip 363 located on the other side of the substrate support structure 403 is used to engage with the VTR body 680.

Furthermore, lips 366 are used to engage with the upper body 751a of the handling robot, and the lip 364 is used to engage with the finger 702' extending from the upper body 751a of the handling robot such that the substrate receiving unit is able to independently carry the substrate support structure 403. The position of the fingers 702' in combination with the different orientation of the two sets of fingers 702' and 685 with respect to each other (i.e. at an angle) allows both sets of fingers to hold the substrate support structure 403 simultaneously without interfering with each other. As a result, if one of the sets of fingers is retracted, the substrate support structure 403 will be held by the other set of fingers. The design of the respective handling robots, i.e. VTR carrier 401 and the substrate transfer apparatus 751 in load lock system 310', makes it possible to hand over a substrate 405 and substrate support structure 403 in a direct way. Such handover reduces the space that is needed for substrate support structure transfer, which helps reducing the size of the load lock chamber 310'.

Accordingly a method is provided wherein substrates are loaded from and into a processing and/or vacuum chamber of a lithography system. The substrates are handled by means of a load lock system, wherein the load lock system comprises a load lock chamber and a transfer apparatus, in particular according to any one of the examples described with reference to the figures. The transfer apparatus comprises a sub-frame at least partially arranged in the load lock chamber, an arm which is, with a proximal end thereof, movably connected to the sub-frame, and a substrate receiving unit which is connected to a distal end of the arm. The method comprises the steps of:
  receiving a substrate on the substrate receiving unit of the transfer apparatus in the load lock chamber;
  extending the transfer apparatus in order to transfer at least part of the substrate receiving unit with the substrate through an opening between the load lock chamber and the lithography system;
  placing the substrate in the lithography system;
  retracting the transfer apparatus from the lithography system back into the load lock chamber; and
  closing the opening;
  wherein the arm comprises an at least four-bar linkage, which is arranged to guide the arm and the substrate receiving unit in a predetermined transfer motion when extending and retracting the transfer apparatus. According to the invention only one arm part is driven in order to perform the predetermined transfer motion between the retracted and extended position of the substrate receiving unit carried by said arm.

In case the lithography system further comprises a vacuum chamber, the method further comprises the step of:
  reducing the pressure in the load lock chamber and opening the opening to the vacuum chamber before the substrate is transferred into the vacuum chamber.

The substrates are transferred from or to a load lock chamber of a load lock system through an opening. In case the processing chamber is a vacuum chamber, the load lock chamber is brought to a vacuum pressure before the opening 705 is opened.

In an particular, with reference to FIGS. 6A and 6B, the substrate receiving unit 751a of the upper arm 751 is arranged of the operational height and receives a to be processed substrate 405 from the carrier 680 of the VTR through the passage 710'.

As shown in FIGS. 6A and 6B, a processed substrate 405' has been obtained by the substrate receiving unit 752a of the lower arm 752, and is held by said substrate receiving unit 752a in the load lock chamber 310'. After the to be processed substrate 405 has been delivered to the upper receiving unit 751a, and the VTR has at least partially retracted in the VTR space 400, the sub-frame 754 is moved vertically upward to position the lower arm 752 and its substrate receiving unit 752a at the operational height. At this position the carrier 680 of the VTR reaches through the passage 710' and picks up the processed substrate 405' and transfers the processed substrate 405' into the VTR space 400.

Subsequently, the empty lower arm 752 is moved to the extended position to reach through the opening 705' to pick up a processed substrate from the lithography apparatus. The processed substrate is transferred through the opening 705' by moving the arm 752 in the retracted position. Subsequently, the sub-frame 754 is moved vertically downward to position the upper arm 751 and its substrate receiving unit 751a at the operational height. Next the upper arm 751 is moved to the extended position to move the to be processed substrate through the opening 705', and to deliver the to be processed substrate to the lithography apparatus. The empty upper arm 751 is moved back in the retracted position, and is ready to receive a new to be processed substrate 405 from the carrier 680 of the VTR through the passage 710'.

In case the lithography system needs to operate under vacuum conditions, the processing chamber of the lithography apparatus is a vacuum chamber. The load lock system 310' is then provided with a pump down system 890 comprising a vacuum pump which is positioned outside the load lock chamber, which pump down system 890 brings the load lock chamber from atmospheric pressure to high vacuum in 4 minutes. During the pump down, both the openings 705', 710' are closed.

Before the opening 705' that connects the load lock chamber 310' to the vacuum chamber of the lithography system is opened, the vacuum pump reduces the pressure of the load lock chamber to high vacuum. When the high vacuum has been reached, the opening 705' is opened and the processed substrate in the lithography system is replaced by a to-be-processed substrate as described above. Subsequently, the opening 705' is closed and the load lock chamber is vented in order to bring the pressure to atmospheric pressure.

Subsequently, the opening 710' to the VTR space 400 is opened and the processed substrate in the load lock chamber 310' is replaced by a to-be-processed substrate from the VTR robot as described above.

By mounting the two arms 751, 752 on a sub-frame 754 in the load lock chamber 310', moving the sub-frame 754 with two arms 751, 752 allows positioning one of the arms at operational height in front of the opening 705', 710' to allow transfer through that opening, while moving the other arm away from the operational height at the same time.

The four-bar linkage provides a very stable and robust mechanism for transferring the substrates since the bars form a closed loop and are fitted with relatively large bearings in the hinge points. Using the four-bar linkage according to the invention results in a high X,Y-positioning accuracy, that is the accuracy in the horizontal plane within which the substrate is placed in the lithography apparatus. Said accuracy is, for example, in a range of ±0.20 mm. In addition, there is low deflection of the extended arm. Furthermore such deflection, if any, will show low hysteresis. Due to the low deflection, the four-bar linkage according to the invention has a very small Z-height, for example ±1.33 mm over the full extension of the arm through the opening 705. This reduces the size required for the opening 705. In addition this allows to reduce the volume of the load lock chamber, which reduces the time needed to obtain the desired vacuum in the load lock chamber, which in turn increases the throughput.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

In summary, the present invention relates to an apparatus and a method for transferring substrates into and out of a processing chamber, such as a vacuum chamber, in a lithography apparatus. The load lock system comprises: a load lock chamber provided with an opening for allowing passage of a substrate in and out of the load lock chamber, and a transfer apparatus comprising a sub-frame at least partially arranged in the load lock chamber, an arm which is, with a proximal end thereof, connected to the sub-frame, and a substrate receiving unit which is connected to a distal end of the arm. The arm comprises at least three hinging arm parts, wherein a first and a second arm part are hingedly connected to the sub-frame with a proximal end thereof. A third arm part is hingedly connected to the distal ends of the first and second arm parts. The arm parts are arranged to form a four-bar linkage.

The invention claimed is:

1. A load lock system for a lithography system, wherein the lithography system is adapted for processing a substrate, the load lock system comprising:
   a load lock chamber provided with an opening at an operational height for allowing passage of the substrate from within the load lock chamber to outside of the load lock chamber,
   a load lock transfer apparatus at least partially arranged in the load lock chamber, comprising an arm for receiving the substrate and for transferring said substrate through the opening,
   wherein the arm is movable within the load lock chamber along a substantially vertical axis between the operational height and a non-operational height different from said operational height,
   an arm transfer drive for providing a drive force for driving a transfer movement of the arm through the opening,
   wherein the arm is movable relative to the arm transfer drive along said substantially vertical axis,
   wherein the arm transfer drive is arranged such that movement of the arm relative to the arm transfer drive along the substantially vertical axis from the non-operational height to the operational height causes the arm transfer drive to couple to the arm for transmitting the drive force to the arm, and
   wherein the arm transfer drive is arranged such that movement of said arm relative to the arm transfer drive along said substantially vertical axis from the operational height to said non-operational height causes the arm transfer drive to uncouple from the arm.

2. Load lock system according to claim 1, further comprising an arm transfer transmission unit for transmitting the drive force of the arm transfer drive to the arm.

3. Load lock system according to claim 1, wherein the arm transfer drive comprises a keyed joint, comprising a shaft having a key and wherein the arm comprises a respective key seat for coupling the arm transfer drive to the arm.

4. Load lock system according to claim 1, wherein the arm is a first arm and the load lock transfer apparatus further comprises a second arm spaced apart from the first arm along the substantially vertical axis,
- wherein the second arm is movable within the load lock chamber along said substantially vertical axis between the operational height and a non-operational height different from said operational height;
- wherein the arm transfer drive is further arranged for providing a drive force for driving a transfer movement of the second arm through the opening;
- wherein the second arm is movable relative to said arm transfer drive along said substantially vertical axis,
- wherein the arm transfer drive is arranged such that movement of the second arm relative to the arm transfer drive along the substantially vertical axis from the non-operational height to the operational height causes the arm transfer drive to couple to the second arm for transmitting the drive force to the arm, and
- wherein the arm transfer drive is arranged such that movement of said second arm relative to the arm transfer drive along said substantially vertical axis from the operational height to said non-operational height causes the arm transfer drive to uncouple from the second arm.

5. Load lock system according to claim 4, wherein the arm transfer drive comprises a keyed joint, comprising a shaft having a key and wherein the second arm comprises a key seat for engaging the key of the keyed joint for transmitting the drive force to the second arm when the second arm is at said operational height.

6. Load lock system according to claim 4, wherein the arm transfer drive comprises a single motor for driving the transfer movement of the first and the second arm.

7. Load lock system according to claim 4, wherein the load lock transfer apparatus comprises a sub-frame, wherein both the first arm and the second arm are carried by said sub-frame, wherein the sub-frame is movable along the substantially vertical axis to position either the first arm or the second arm at the operational height.

8. Load lock system according to claim 7, wherein the sub-frame is provided with a sub-frame locking system for locking the position of the sub-frame along the vertical axis when one of the arms is extended.

9. Load lock system according to claim 4, wherein the first arm and the second arm are arranged at a fixed distance to each other along the substantially vertical axis.

10. Load lock system according to claim 1, wherein the arm transfer drive is at least partially arranged outside the load lock chamber.

11. The load lock system according to claim 1, wherein the load lock transfer apparatus comprising a sub-frame at least partially arranged in the load lock chamber, wherein the arm is, with a proximal end thereof, connected to the sub-frame, and a substrate receiving unit which is connected to a distal end of the arm,
- wherein the arm comprises at least three hinging arm parts, wherein a first and a second arm part of said three hinging arm parts are hingedly connected to the sub-frame with a proximal end of the first and second arm parts, and wherein a third arm part of said three hinging arm parts is hingedly connected to the distal ends of the first and second arm parts respectively,
- wherein the at least three hinging arm parts are arranged to form an at least four-bar linkage which is arranged to guide the arm in a predetermined transfer motion for moving at least part of the substrate receiving unit through the opening.

12. The load lock system according to claim 11, wherein the first arm part is rotationally mounted around an axis, and wherein the arm transfer drive is coupled or is arranged to be coupled to said first arm part.

13. The load lock system according to claim 11, wherein four-bar linkage comprises at least three bearings.

14. The load lock system according to claim 11, wherein the substrate receiving unit is rigidly connected to the third arm part.

15. The load lock system according to claim 11, wherein the substrate receiving unit comprises hinge points which are arranged for connecting the first and second arm parts.

16. The load lock system according to claim 11, wherein one of the first and second arm parts is arranged at least partially below the other one of the first and second arm parts.

17. The load lock system according to claim 11, wherein the predetermined transfer motion is arranged to provide a substantially linear path for the substrate receiving unit at or near the opening.

18. The load lock system according to claim 11, wherein the transfer apparatus is movable between a retracted position and an extended position, wherein in the extended position of the transfer apparatus, the substrate receiving unit is at least partially arranged to pass through the opening.

19. The load lock system according to claim 18, wherein one of the first and second arm parts is arranged at least partially below the other one of the first and second arm parts, such that the first arm part and the second arm part can be arranged in a position wherein the one arm part crosses the other arm part, wherein the first and second arm parts are arranged in a cross-over position in the retracted position.

20. The load lock system according to claim 18, wherein the transfer apparatus comprises a first stop unit which defines the extended position.

21. The load lock system according to claim 20, wherein the first stop unit comprises an end stop, which mechanically limits the movement of the four-bar linkage.

22. The load lock system according to claim 20, wherein the first stop unit comprises a first stop configuration system for adjusting a position of the first stop unit or the end stop thereof.

23. The load lock system according to claim 20, wherein the first stop unit comprises a first member arranged on the first arm part, and a second member arranged on the second arm part, wherein the first and second members are arranged to abut in the extended position to form the end stop.

24. The load lock system according to claim 18, wherein the transfer apparatus comprises a second stop unit which defines the retracted position.

25. The load lock system according to claim 24, wherein the second stop unit comprises a detector for detecting whether or not the transfer apparatus is arranged in the retracted position.

26. The load lock system according to claim 25, wherein the detector is arranged for detecting the presence of an arm part in the retracted position.

27. The load lock system according to claim 25, wherein the detector is arranged on and/or attached to the sub-frame.

28. The load lock system according to claim 24, wherein the second stop unit comprises a second stop configuration system for adjusting a position of the second stop unit or the detector thereof.

29. The load lock system according to claim 24, wherein the detector of the second stop unit, is arranged to detect the presence of the first or second member of the first stop unit in the retracted position.

30. The load lock system according to claim 11, wherein the sub-frame is movable relative to the load lock chamber along a substantially vertical axis.

31. The load lock system according to claim 30, wherein the sub-frame is arranged on a movable carrier, wherein the load lock system comprises a sub-frame drive, coupled to said movable carrier for driving movement of the sub-frame relative to said load lock chamber along the substantially vertical axis.

32. The load lock system according to claim 30, wherein the sub-frame is movable relative to the arm transfer drive along said substantially vertical axis for moving the substrate receiving unit between the operational height and the non-operational height different from said operational height,
   wherein the arm transfer drive is arranged such that movement of the sub-frame relative to the arm transfer drive along the substantially vertical axis from the non-operational height to the operational height causes the arm transfer drive to couple to the arm for transmitting the drive force to the arm, and
   wherein the arm transfer drive is arranged such that movement of said sub-frame relative to the arm transfer drive along said substantially vertical axis from the operational height to said non-operational height causes the arm transfer drive to uncouple from the arm.

33. The load lock system according to claim 11, wherein the load lock system comprises a sub-frame locking system for preventing the sub-frame to be moved in the vertical direction unless the transfer apparatus is in the retracted position in the load lock chamber.

34. The load lock system according to claim 11, wherein the transfer apparatus comprises a transfer locking system for holding the transfer apparatus in the retracted position in the load lock chamber.

35. The load lock system according to claim 11, wherein at least one arm part of each of the arm parts comprises a configuration unit arranged for adjustment of a length of at least one of said arm parts.

36. The Load lock system according to claim 35, wherein, when the arm is in the extended position, the configuration unit is accessible to an operator for adjusting the four-bar linkage.

37. The load lock system according to claim 11, wherein the transfer apparatus is a first transfer apparatus, and wherein the load lock system further comprises a second transfer apparatus, wherein the second transfer apparatus comprising a sub-frame at least partially arranged in the load lock chamber, a second arm which is, with a proximal end thereof, connected to the sub-frame, and a substrate receiving unit which is connected to a distal end of the second arm,
   wherein the second arm comprises at least three hinging arm parts, wherein a first and a second arm part of said three hinging arm parts are hingedly connected to the sub-frame with a proximal end of the first and second arm parts, and wherein a third arm part of said three hinging arm parts is hingedly connected to the distal ends of the first and second arm parts respectively,
   wherein the at least three hinging arm parts are arranged to form an at least four-bar linkage which is arranged to guide the second arm in a predetermined transfer motion for moving at least part of the substrate receiving unit through the opening.

38. The load lock system according to claim 37, wherein the second transfer apparatus is arranged substantially vertically below the first transfer apparatus.

39. The load lock system according to claim 37, wherein the sub-frame of the second transfer apparatus is arranged on a movable carrier.

40. The load lock system according to claim 37, wherein both sub-frames of the first and second transfer apparatuses are arranged on a movable carrier, and wherein the load lock system comprises a sub-frame drive coupled to said movable carrier for driving movement of the sub-frames relative to said load lock chamber along the substantially vertical axis.

41. The load lock system according to claim 37, wherein the load lock system comprises a particle shield extending in a plane between the first and second transfer apparatuses.

42. The load lock system according to claim 41, wherein the particle shield is arranged to extend at least partially above the substrate receiving unit of the second transfer apparatus when the second transfer apparatus is in the retracted position.

43. The load lock system according to claim 41, wherein the particle shield is supported by at least one of the sub-frames and a movable carrier onto which at least one of the sub-frames is arranged.

44. Lithography system comprising a load lock system according to claim 1.

45. Lithography system according to claim 44, comprising a vacuum chamber arranged outside of said load lock chamber, wherein the opening is a passage between the vacuum chamber of the lithography system and the load lock system.

46. Method of using a load lock system, the method comprising the steps of:
   providing the load lock system according to claim 1,
   moving the arm along the substantially vertical axis from the non-operational height to the operational height for coupling the arm to the arm transfer drive; and
   moving the arm along the substantially vertical axis from the operational height to the non-operational height for uncoupling the arm from the arm transfer drive;
   or vice versa.

47. Method according to claim 46, wherein the arm of the load lock transfer apparatus is a first arm, said load lock transfer apparatus further comprising a second arm movable relative to said arm transfer drive along said substantially vertical axis for coupling said second arm to the arm transfer drive when the second arm is at the operational height and for uncoupling the second arm from the arm transfer drive when the second arm is at a non-operational height different from said operational height,
   wherein during said moving of the first arm from or to the operational height, the first arm and the second arm are moved in conjunction to move the second arm to or from the operational height respectively.

* * * * *